(12) United States Patent
Nakayama et al.

(10) Patent No.: US 9,929,379 B2
(45) Date of Patent: Mar. 27, 2018

(54) METHOD FOR PRODUCING ORGANIC ELECTROLUMINESCENT ELEMENT

(71) Applicant: Konica Minolta, Inc., Tokyo (JP)

(72) Inventors: Yoriko Nakayama, Hino (JP); Hirofumi Ohtani, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 62 days.

(21) Appl. No.: 14/891,219

(22) PCT Filed: May 23, 2014

(86) PCT No.: PCT/JP2014/063730
§ 371 (c)(1),
(2) Date: Nov. 13, 2015

(87) PCT Pub. No.: WO2014/199802
PCT Pub. Date: Dec. 18, 2014

(65) Prior Publication Data
US 2016/0093836 A1    Mar. 31, 2016

(30) Foreign Application Priority Data

Jun. 11, 2013  (JP) ................................ 2013-122488

(51) Int. Cl.
*H01L 51/52*   (2006.01)
*H01L 51/56*   (2006.01)
(Continued)

(52) U.S. Cl.
CPC .......... *H01L 51/56* (2013.01); *H01L 51/0015* (2013.01); *H01L 51/0021* (2013.01);
(Continued)

(58) Field of Classification Search
CPC ........................ H01L 51/5203–51/5218; H01L 51/5262–51/5284; H01L 51/56;
(Continued)

(56) References Cited

U.S. PATENT DOCUMENTS

| 2004/0077250 A1* | 4/2004 | Miyadera | ............ H01L 27/3239 445/24 |
| 2005/0280364 A1* | 12/2005 | Omura | ................ H01L 51/5265 313/506 |
| 2014/0272398 A1* | 9/2014 | Hakii | .................. H01L 51/5234 428/336 |

FOREIGN PATENT DOCUMENTS

| CN | 101438626 A | 5/2009 |
| JP | 2009-070816 A | 4/2009 |

(Continued)

OTHER PUBLICATIONS

Korean Office Action dated Mar. 17, 2017 from corresponding Korean Patent Application No. KR 10-2015-7034834; Applicant: Konica Minolta, Inc.; English translation of Korean Office Action; Total of 8 pages.

(Continued)

*Primary Examiner* — Mariceli Santiago
(74) *Attorney, Agent, or Firm* — Lucas & Mercanti, LLP

(57) ABSTRACT

A method for producing an organic electroluminescent element including a transparent substrate, a transparent electrode, an organic functional layer unit, and an electrode counter to the transparent electrode disposed in sequence, the method including: forming a preform of an element satisfying the following expression: $\Delta Exy \geq 0.05$, wherein 0° is an angle orthogonal to the transparent substrate and $\Delta Exy$ represents a chromaticity difference of a reflected color measured at a tilted angle within a range of 0 to 80° with (Continued)

respect to the transparent substrate; and irradiating a specific region of the preform of the element with light.

4 Claims, 6 Drawing Sheets

(51) Int. Cl.
  *H01L 51/00* (2006.01)
  *H05B 33/28* (2006.01)
  *H01L 51/50* (2006.01)

(52) U.S. Cl.
  CPC ...... *H01L 51/0031* (2013.01); *H01L 51/0072* (2013.01); *H01L 51/5044* (2013.01); *H01L 51/5206* (2013.01); *H05B 33/28* (2013.01); *H01L 51/006* (2013.01); *H01L 51/0067* (2013.01); *H01L 51/0073* (2013.01); *H01L 51/0085* (2013.01); *H01L 51/0096* (2013.01); *H01L 51/5016* (2013.01); *H01L 51/5253* (2013.01); *H01L 2251/301* (2013.01)

(58) Field of Classification Search
  CPC ........ H01L 51/0015; H01L 51/0026–51/0028; H01L 51/0031
  See application file for complete search history.

(56) References Cited

FOREIGN PATENT DOCUMENTS

| JP | 2009070816 A | 4/2009 |
|----|----|----|
| JP | 2011-155002 A | 8/2011 |
| JP | 2011155002 A | 8/2011 |
| JP | 2012-028335 A | 2/2012 |
| JP | 2012028335 A | 2/2012 |
| JP | 2012-054091 A | 3/2012 |
| JP | 2012054091 A | 3/2012 |
| KR | 10-2005-0042479 A | 5/2005 |
| KR | 10-2006-0046476 A | 5/2006 |
| KR | 10-2012-0120372 A | 11/2012 |
| KR | 10-2013-0015309 A | 2/2013 |

OTHER PUBLICATIONS

Office Action dated Jul. 27, 2016 from corresponding Chinese Application; Application No. 201480033028.3; Applicant: Konica Minolta, Inc.; Title of Invention: Method for Producing Organic Electroluminescent Element; English translation of Office Action; Total of 17 pages.
International Search Report dated Jul. 8, 2014 for Application No. PCT/JP2014/063730.
IPRP; Application No. PCT/JP2014/063730; Filing Date: May 23, 2014; Applicant: Konica Minolta, Inc.; total of 5 pages.
English translation of IPRP; Application No. PCT/JP2014/063730; total of 5 pages.
Korean Office Action dated Sep. 29, 2017 from corresponding Korean Patent Application No. KR 10-2015-7034834.
Notice of Reasons for Rejection dated Dec. 5, 2017 from corresponding Japanese Patent Application No. JP 2015-522695 and English translation.

* cited by examiner

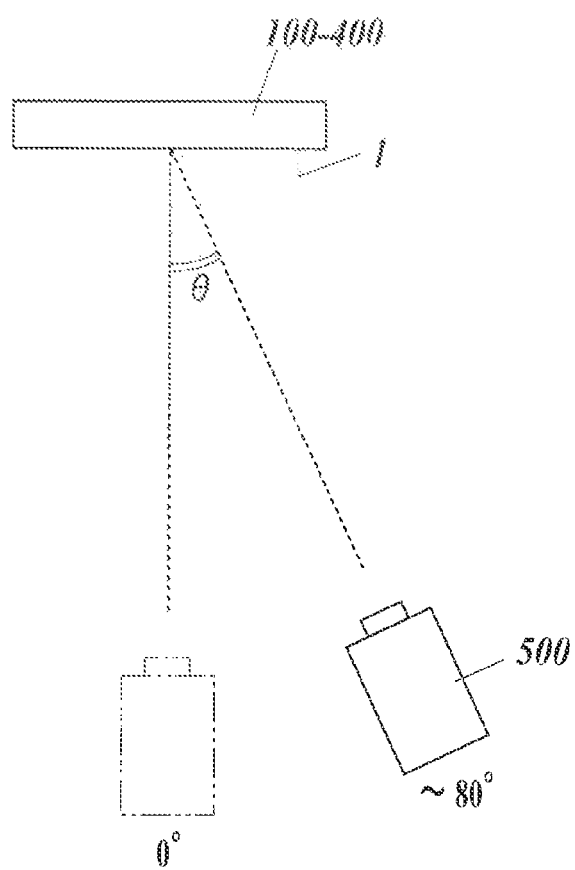

METHOD FOR PRODUCING ORGANIC ELECTROLUMINESCENT ELEMENT

CROSS REFERENCE TO RELATED APPLICATION

This Application is a 371 of PCT/JP2014/063730 filed on May 23, 2014, which, in turn, claimed the priority of Japanese Patent Application No. JP2013-122488 filed on Jun. 11, 2013, both applications are incorporated herein by reference.

TECHNICAL FIELD

The present invention relates to a method for producing an organic electroluminescent element. In specific, the present invention relates to a method for producing an organic electroluminescent element which exhibits different hues at different observation angles during non-emission of light, and which forms a clear emission pattern during emission of light.

BACKGROUND ART

Luminous electronic display devices include electroluminescent displays (hereinafter referred to as "ELDs"). Components of ELDs include an inorganic electroluminescent element and an organic electroluminescent element (hereinafter referred to as "organic EL element"). An inorganic electroluminescent element, which is used as a planar light source, requires a high AC voltage for driving the luminous element.

An organic EL element includes an anode, a cathode, and a luminous layer containing a luminous compound and disposed between the anode and the cathode, and emits light (fluorescence or phosphorescence) through deactivation of excitons generated by recombination of electrons and holes injected into the luminous layer. The organic EL element, which is of a self-luminous type, can emit light at a low voltage of about several volts to several tens of volts, and has a wide viewing angle and high visibility. The organic EL element, which is a thin, completely solid element, has received attention in terms of, for example, space saving or portability. Attempts have been made to produce a flexible organic EL element by replacing a rigid substrate with a flexible plastic or metal foil substrate, so that the organic EL element of a completely solid type can be more effectively utilized.

Organic EL elements are also characterized as being planar light sources, unlike primary light sources which have been put into practice, such as light-emitting diodes and cold-cathode tubes. Organic EL elements are applied to light sources for illumination and backlight units of various displays, which effectively utilize the characteristics of the organic EL elements. In particular, organic EL elements are suitable for use in backlight units of full-color liquid crystal displays, which have been increasingly demanded.

In contrast to a conventional EL element which emits only light of a single color, Patent Literature 1 discloses an organic EL element including a luminous layer having regions which are intentionally deprived of emission function through irradiation with UV rays, a laser beam, or an electron beam (i.e., formation of non-emission regions on the luminous layer), the organic EL element being capable of forming emission patterns corresponding to the non-emission regions during emission of light (see paragraphs [0026] and and Example 1).

Although Patent Literature 1 discloses a technique for formation of emission patterns during emission of light, the literature does not refer to creation of values of the organic EL element during non-emission of light.

PRIOR ART DOCUMENT

Patent Literature

Patent Literature 1: Japanese Unexamined Patent Application Publication No. 2012-28335

SUMMARY OF INVENTION

Problems to be Solved by the Invention

The present invention has been attained in consideration of the problems and circumstances described above. An object of the present invention is to provide a method for producing an organic electroluminescent element which exhibits different hues at different observation angles during non-emission of light, and which forms a clear emission pattern during emission of light.

Means for Solving the Problem

The present inventors have conducted studies to solve the problems described above, and have found that an organic EL element exhibiting different hues at different observation angles can be produced from a preform of the element exhibiting a specific color difference, and that a specific region of the preform can be transformed into a non-luminous region by irradiation of the region with light. The present invention has been accomplished on the basis of these findings.

The problems described above are accordingly solved by the present invention which is characterized as follows:

Aspect 1: A method for producing an organic electroluminescent element including a transparent substrate, a transparent electrode, an organic functional layer unit, and an electrode counter to the transparent electrode disposed in sequence, the method including:

forming a preform of an element satisfying the following expression: $\Delta Exy \geq 0.05$, wherein 0° is an angle orthogonal to the transparent substrate and $\Delta Exy$ represents a chromaticity difference of a reflected color measured at a tilted angle within a range of 0 to 80° with respect to the transparent substrate; and irradiating a specific region of the preform of the element with light.

Aspect 2: The method for producing an organic EL element according to Aspect 1, wherein the transparent electrode disposed on the transparent substrate includes a metal layer including elemental silver or a silver-based alloy.

Aspect 3: The method for producing an organic EL element according to Aspect 1, wherein the transparent electrode disposed on the transparent substrate includes a metal layer including elemental silver or a silver-based alloy, and a nitrogen-containing layer containing a compound having a structure represented by Formula (1):

[F1]

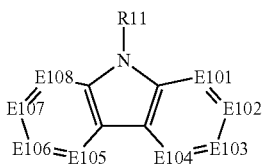

General Formula (1)

wherein E101 to E108 each represent —C(R12)= or —N=, at least one of E101 to E108 is —N=, and R11 and R12 each represent a hydrogen atom or a substituent.

Aspect 4: The method for producing an organic EL element according to any one of Aspects 1 to 3, wherein the transparent substrate includes a resin film, and the preform of the element is irradiated with light not containing a wavelength component of 340 nm or shorter.

Advantageous Effects of Invention

The present invention can provide a method for producing an organic EL element which exhibits different hues at different observation angles during non-emission of light, and which forms a clear emission pattern during emission of light.

The mechanism by which the advantageous effects of the present invention are expressed has not yet been elucidated, but is presumed as follows:

The method of the present invention includes a step of forming a preform of an element satisfying the expression $\Delta Exy \geq 0.05$, and thus the method can probably produce an organic EL element which exhibits different hues at different observation angles during non-emission of light.

The method of the present invention also includes a step of irradiating a specific region of the preform of the element with light. Thus, the method can probably produce an organic EL element which forms a clear emission pattern, resulting from deprivation of the function of a compound which is contained in the material of the organic functional layer unit and is essential for luminous phenomena.

BRIEF DESCRIPTION OF DRAWINGS

FIG. 7 is a schematic top view illustrating the positional relationship between an organic EL element and a chromaticity meter.

EMBODIMENT FOR CARRYING OUT THE INVENTION

The present invention provide a method for producing an organic electroluminescent element including a transparent substrate, a transparent electrode, an organic functional layer unit, and an electrode counter to the transparent electrode disposed in sequence, the method including: forming a preform of an element satisfying the following expression: $\Delta Exy \geq 0.05$, wherein 0° is an angle orthogonal to the transparent substrate and $\Delta Exy$ represents a chromaticity difference of a reflected color measured at a tilted angle within a range of 0 to 80° with respect to the transparent substrate; and irradiating a specific region of the preform of the element with light.

These technical characteristics are common to Aspects 1 to 4 of the present invention.

In an embodiment of the present invention, from the viewpoint of obtaining the effects of the present invention preferably, the transparent electrode disposed on the transparent substrate includes a metal layer including elemental silver or a silver-based alloy or a metal layer including elemental silver or a silver-based alloy and a nitrogen-containing layer containing a certain compound.

Further, according to an embodiment of the present invention, preferably, the transparent substrate includes a resin film, and the preform of the element is irradiated with light not containing a wavelength component of 340 nm or shorter. This embodiment inhibits degradation of the resin of the transparent substrate, resulting in prevention of discoloration of the resin film.

The present invention, the contexture thereof, and embodiments and aspects for implementing the present invention will now be described in detail. As used herein, the term "to" between two numerical values indicates that the numeric values before and after the term are inclusive as the lower limit value and the upper limit value, respectively.

Now will be described the configuration of an organic EL element, a method for the production thereof, and components thereof.

<<Configuration of Organic EL Element>>

A basic configuration of the organic EL element will be described with reference to the drawings.

The organic EL element includes a transparent substrate, a transparent electrode, an organic functional layer unit, and an electrode counter to the transparent electrode disposed in sequence.

In the organic EL element, the transparent electrode and the counter electrode serve as an anode and a cathode, respectively, or vice versa, depending on conditions for application of voltage. In the following description, the electrode adjacent to the transparent substrate is referred to as "first electrode", and the electrode disposed on the opposite side of the organic functional layer unit from the first electrode is referred to as "second electrode".

Now will be described typical configurations in which a first electrode 2 and a second electrode 6 serve as an anode and a cathode, respectively, with reference to FIGS. 1 to 4.

Figure 1:
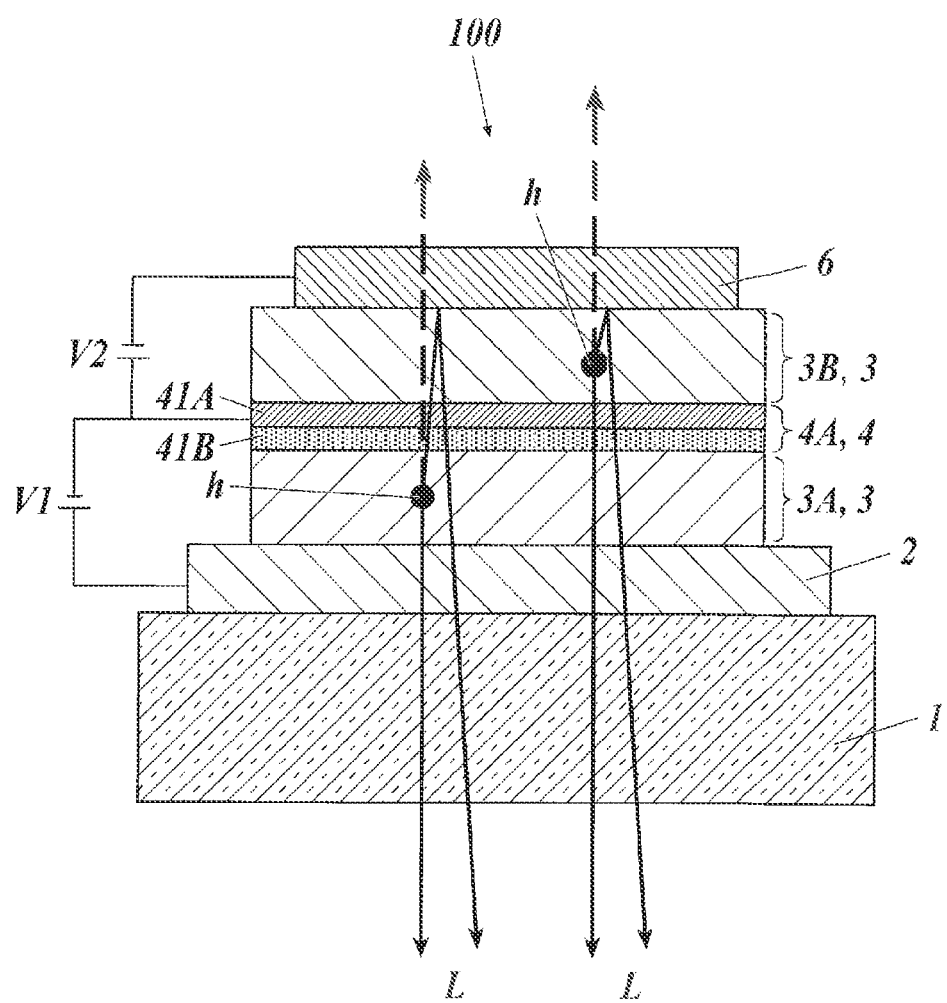
FIG. 1 is a schematic cross-sectional view of the configuration of an exemplary organic EL element including two organic functional layer units.
Figure 2:
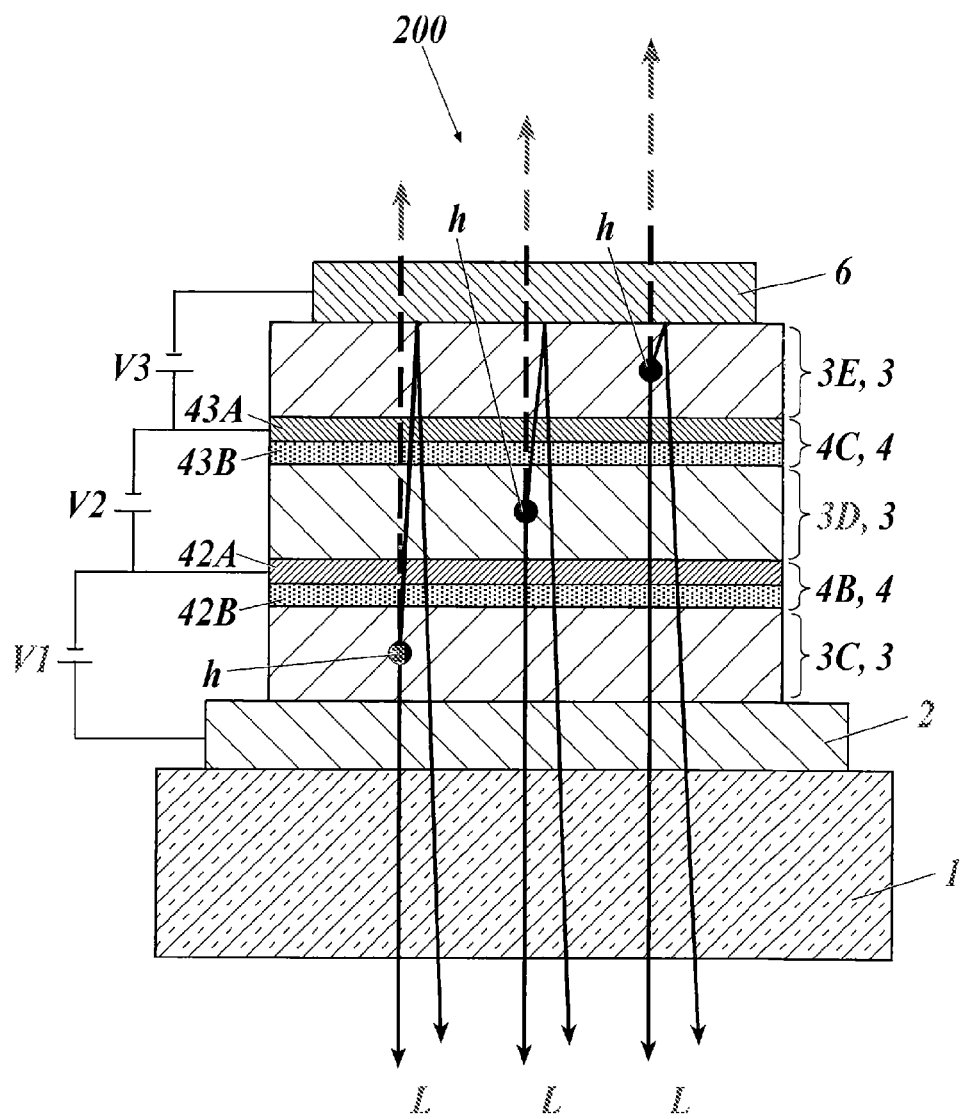
FIG. 2 is a schematic cross-sectional view of the configuration of an exemplary organic EL element including three organic functional layer units.

Each of organic EL elements 100 and 200 shown in FIGS. 1 and 2 includes a pair of main electrodes (first electrode 2 and second electrode 6), one of which is a transparent electrode, at least two organic functional layer units 3 disposed between the electrodes, and an intermediate electrode layer 4 disposed between the organic functional layer units 3. Each of the organic functional layer units 3 includes a plurality of organic functional layers including a luminous layer. At least one intermediate electrode layer 4 is preferably a transparent electrode. The organic functional layer unit 3 which emits light of the shortest wavelength is preferably disposed farthest from the transparent electrode (first electrode 2) of the organic EL element 100 or 200 through which light is mainly extracted to the outside.

FIG. 1 is a schematic cross-sectional view of the configuration of the organic EL element 100 including two organic functional layer units 3A and 3B.

With reference to FIG. 1, the organic EL element 100 includes a transparent substrate 1, a first electrode 2 (anode) or a transparent electrode, a first organic functional layer unit 3A, an intermediate electrode layer unit 4A including an intermediate electrode 41A and an underlying layer 41B, a second organic functional layer unit 3B, and a second electrode 6 (cathode) or a counter electrode disposed in sequence. The underlying layer 41B, which is not an essential component, contains a silver-affinity compound, such as a nitrogen-containing aromatic compound. The underlying layer 41B is preferably provided, because it is suitable for use as an electron transporting layer with high electron transportability.

In the configuration shown in FIG. 1, the first electrode 2 (transparent electrode) serves as an anode, and the second electrode 6 (counter electrode) serves as a cathode.

In this configuration, the first organic functional layer unit 3A includes a hole injecting layer, a hole transporting layer, a luminous layer, an electron transporting layer, and an electron injecting layer that are disposed in sequence from the transparent substrate 1. Similarly, the second organic functional layer unit 3B includes a hole injecting layer, a hole transporting layer, a luminous layer, an electron transporting layer, and an electron injecting layer that are disposed in sequence from the transparent substrate 1.

A non-illustrated independent connection terminal is disposed between the organic functional layer units 3A and 3B. As described below, an underlying layer may optionally be provided between the transparent substrate 1 and the first electrode 2.

The intermediate electrode layer unit 4A includes the intermediate electrode 41A and the underlying layer 41B. The first electrode 2 is connected to the intermediate electrode 41A with a lead line. The first organic functional layer unit 3A emits light at a driving voltage V1 of 2 to 40 V applied to the connection terminals of the respective electrodes. Similarly, the intermediate electrode 41A is connected to the second electrode 6 with a lead line. The second organic functional layer unit 3B emits light at a driving voltage V2 of 2 to 40 V applied to the connection terminals of the respective electrodes.

For driving of the organic EL element 100, a DC driving voltage V1 of 2 to 40 V is applied between the first electrode 2 and the intermediate electrode 41A, and a DC driving voltage V2 of 2 to 40 V is applied between the intermediate electrode 41A and the second electrode 6 such that the first electrode (anode) 2 has a positive potential and the second electrode (cathode) 6 has a negative potential. An intermediate voltage between the voltages applied to the anode and the cathode is applied to the intermediate electrode layer 4A.

Light L emitted at points h of the organic functional layer units 3A and 3B is extracted to the outside through the first electrode 2, which is a transparent electrode. Light propagating toward the second electrode 6 is reflected by the second electrode 6 and is extracted through the first electrode 2.

Both the first electrode 2 and the second electrode 6 may serve as anodes, and the intermediate electrode layer 4A disposed between the two organic functional layer units 3A and 3B may serve as a cathode.

In this case, a driving voltage V1 of about 2 to 40 V is applied such that the first electrode 2 has a positive potential and the intermediate electrode layer 4A has a negative potential, and a driving voltage of V2 of about 2 to 40 V is applied such that the second electrode 6 has a positive potential and the intermediate electrode layer 4A has a negative potential, to allow the organic functional layer units 3A and 3B to emit light.

In this configuration, the first organic functional layer unit 3A includes a hole injecting layer, a hole transporting layer, a luminous layer, an electron transporting layer, and an electron injecting layer that are disposed in sequence from the transparent substrate 1. In contrast, the second organic functional layer unit B includes an electron injecting layer, an electron transporting layer, a luminous layer, a hole transporting layer, and a hole injecting layer that are disposed in sequence from the transparent substrate 1.

FIG. 2 is a schematic cross-sectional view of the configuration of an organic EL element 200 including three organic functional layer units 3C, 3D, and 3E.

With reference to FIG. 2, the organic EL element 200 includes a transparent substrate 1, a first or transparent electrode 2, a first organic functional layer unit 3C, a first intermediate electrode layer unit 4B, a second organic functional layer unit 3D, a second intermediate electrode layer unit 4C, a third organic functional layer unit 3E, and a second or counter electrode 6 disposed in sequence. The first intermediate electrode layer unit 4B and the second intermediate electrode layer unit 4C respectively include nitrogen atom-containing underlying layers 42B and 43B, on the transparent substrate 1 side. Intermediate electrodes 42A and 43A are respectively disposed over the underlying layers 42B and 43B.

In the configuration shown in FIG. 2, the first electrode 2 (transparent electrode) serves as an anode, and the second electrode 6 serves as a cathode.

In this configuration, the first organic functional layer unit 3C includes a hole injecting layer, a hole transporting layer, a luminous layer, an electron transporting layer, and an electron injecting layer that are disposed in sequence from the transparent substrate 1 side. Similarly, each of the second organic functional layer unit 3D and the third organic functional layer unit 3E includes a hole injecting layer, a hole transporting layer, a luminous layer, an electron transporting layer, and an electron injecting layer that are disposed in sequence from the transparent substrate 1 side.

The first electrode 2 is connected to the first intermediate electrode 42A with a lead line. The first organic functional layer unit 3C emits light at a driving voltage V1 of 2 to 40 V applied to the connection terminals of the respective electrodes.

Similarly, the first intermediate electrode 42A is connected to the second intermediate electrode 43A with a lead line. The second organic functional layer unit 3D emits light at a driving voltage V3 of 2 to 40 V applied to the connection terminals of the respective electrodes. Also, the second intermediate electrode 43A is connected to the second electrode 6 with a lead line. The third organic functional layer unit 3E emits light at a driving voltage V3 of 2 to 40 V applied to the connection terminals of the respective electrodes.

For driving of the organic EL element 200, a DC driving voltage V1, V2, or V3 of 2 to 40 V is applied such that the first electrode (anode) 2 has a positive potential and the second electrode (cathode) 6 has a negative potential. An intermediate voltage between the voltages applied to the anode and the cathode is applied to the first intermediate electrode 42A and the second intermediate electrode 43A.

In the organic EL element 200 including the three organic functional layer units 3C, 3D, and 3E, both the first electrode 2 and the second electrode 6 may serve as anodes, and both the first intermediate electrode 42A and the second intermediate electrode 43A may serve as cathodes, as in the organic EL element including the two organic functional layer units 3A and 3B.

Figure 3:
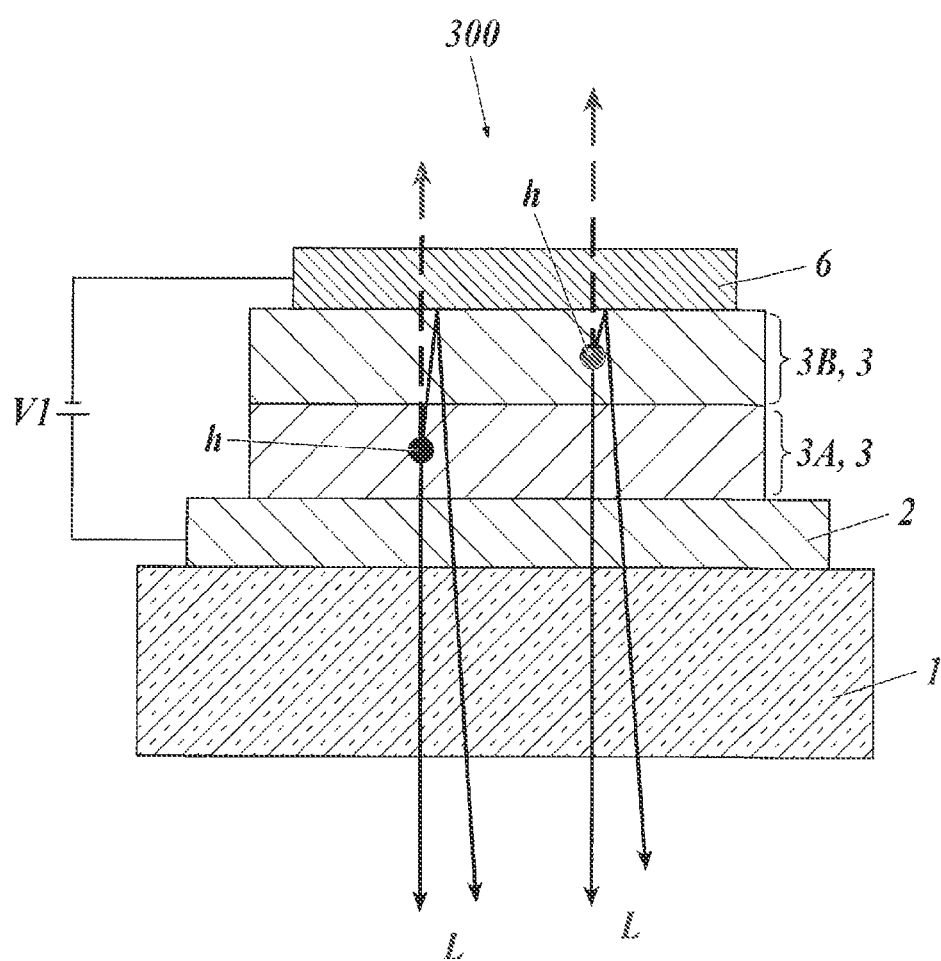
FIG. 3 is a schematic cross-sectional view of the configuration of another exemplary organic EL element including two organic functional layer units.

FIG. 3 is a schematic cross-sectional view of the configuration of another exemplary organic EL element including two organic functional layer units 3A and 3B.

The two-unit or tandem organic EL element 300 shown in FIG. 3 has the same configuration as the organic EL element 100 shown in FIG. 1 and including the two organic functional layer units 3A and 3B, except that the intermediate electrode layer unit 4A is omitted. In the organic EL element 300, the first electrode 2 (transparent electrode) is connected to the second electrode 6 (counter electrode) with a lead line. The first organic functional layer unit 3A and the second organic functional layer unit 3B emit light at a driving voltage V1 of 2 to 40 V applied to the connection terminals of the respective electrodes.

In the organic EL element 300 shown in FIG. 3, the first organic functional layer unit 3A includes a hole injecting layer, a hole transporting layer, a luminous layer, an electron transporting layer, and an electron injecting layer that are disposed in sequence from the transparent substrate 1 side, as in the configuration shown in FIG. 1. Similarly, the second organic functional layer unit 3B includes a hole injecting layer, a hole transporting layer, a luminous layer, an electron transporting layer, and an electron injecting layer that are disposed in sequence from the transparent substrate 1.

An independent connection terminal (not depicted) is disposed between the organic functional layer units 3A and 3B. In the configuration shown in FIG. 3, an underlying layer may optionally be provided between the transparent substrate 1 and the first electrode 2.

The organic EL element 300 shown in FIG. 3 may include either the organic functional layer unit 3A or 3B; i.e., one of the organic functional layer units 3A and 3B may be omitted.

Figure 4:
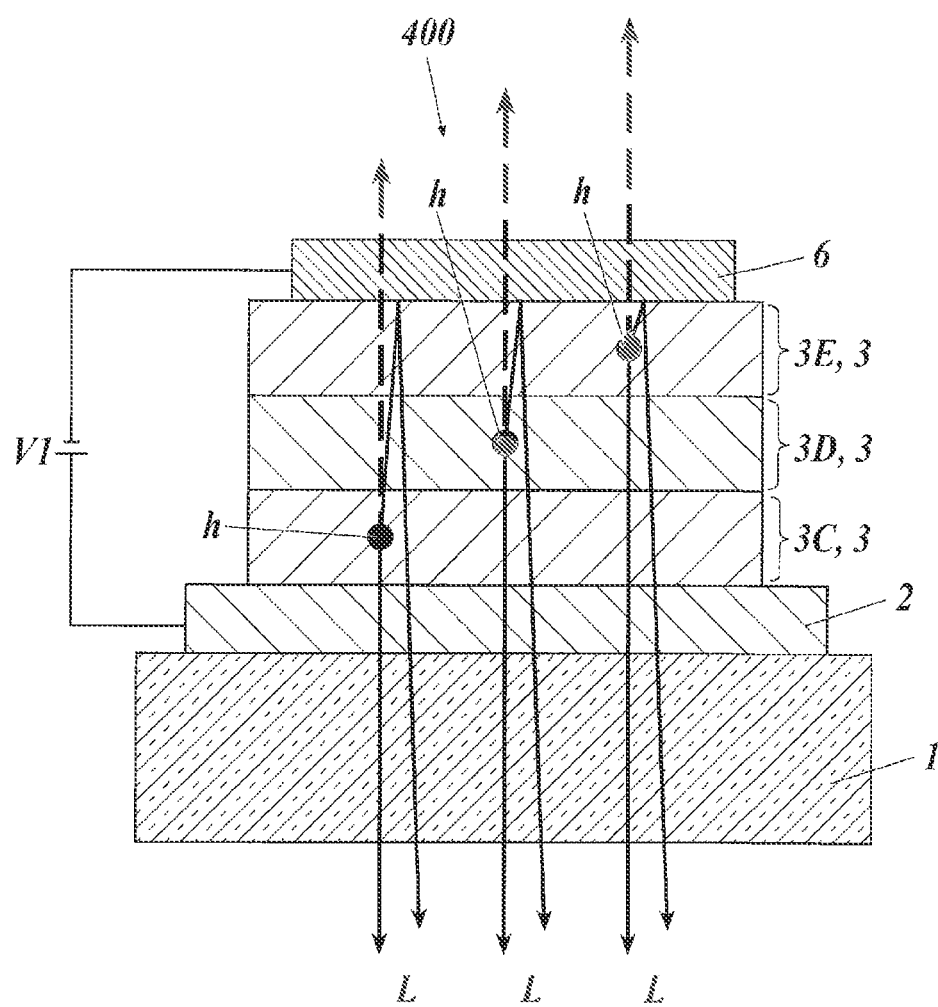
FIG. 4 is a schematic cross-sectional view of the configuration of another exemplary organic EL element including three organic functional layer units.

FIG. 4 is a schematic cross-sectional view of the configuration of another exemplary organic EL element including three organic functional layer units 3C, 3D, and 3E.

The three-unit or tandem organic EL element 400 shown in FIG. 4 has the same configuration as the organic EL element 200 shown in FIG. 2 and including the three organic functional layer units 3C, 3D, and 3E, except that the intermediate electrode layer units 4B and 4C are omitted. In the organic EL element 400, the first electrode 2 is connected to the second electrode 6 with a lead line. The first organic functional layer unit 3C, the second organic functional layer unit 3D, and the third organic functional layer unit 3E emit light at a driving voltage V1 of 2 to 40 V applied to the connection terminals of the respective electrodes.

In the organic EL element 400 shown in FIG. 4, the first organic functional layer unit 3C includes a hole injecting layer, a hole transporting layer, a luminous layer, an electron transporting layer, and an electron injecting layer that are disposed in sequence from the transparent substrate 1, as in the configuration shown in FIG. 2. Similarly, the second organic functional layer unit 3D includes a hole injecting layer, a hole transporting layer, a luminous layer, an electron transporting layer, and an electron injecting layer that are disposed in sequence from the transparent substrate 1.

An independent connection terminal (not depicted) is disposed between the organic functional layer units 3C and 3D or between the organic functional layer units 3D and 3E. In the configuration shown in FIG. 4, an underlying layer may optionally be provided between the transparent substrate 1 and the first electrode 2.

The organic EL element 400 shown in FIG. 4 may include only one of the organic functional layer units 3C, 3D, and 3E; i.e., any two of the organic functional layer units 3C, 3D, and 3E may be omitted.

<<Configuration of Organic Functional Layer Unit>>

Each of the organic EL elements 100 to 400 basically has a structure in which two or more organic functional layer units 3 are disposed between the first electrode 2 (transparent electrode) and the second electrode 6 (counter electrode). The organic functional layer units 3 may be separated by the intermediate electrode layer unit 4 as shown in FIG. 1. Alternatively, the organic functional layer units 3 may be directly bonded together as shown in FIG. 3.

The organic EL element of the present invention may include three or more organic functional layer units 3; for example, an organic functional layer unit 3 including a blue light-emitting layer, an organic functional layer unit 3 including a green light-emitting layer, and an organic functional layer unit 3 including a red light-emitting layer, so as to emit light of desired colors (including white).

The total thickness of organic functional layers of the organic functional layer units 3 is preferably within a range of {the number of the organic functional layer units×(100 to 200)} nm. A total thickness within this range probably leads to prevention of short circuit and an increase in driving voltage. Examples of the organic functional layers include a hole injecting layer, a hole transporting layer, a luminous layer, an electron transporting layer, and an electron injecting layer.

The organic functional layer unit 3 may have any common layer configuration. In an exemplary layer configuration, a hole injecting layer, a hole transporting layer, a luminous layer, an electron transporting layer, and an electron injecting layer are disposed in sequence on the first electrode 2 serving as an anode. This configuration requires at least a luminous layer composed of an organic material. The hole injecting layer and the hole transporting layer may be provided in the form of a hole injecting/transporting layer. The electron transporting layer and the electron injecting layer may be provided in the form of an electron transporting/injecting layer. Among the layers of the organic functional layer unit 3, the electron injecting layer may be composed of an inorganic material.

The organic functional layer unit 3 may optionally include a hole blocking layer or an electron blocking layer in necessary places. The organic functional layer unit 3 may include luminous layers emitting light L of different wavelengths, the luminous layers being disposed with a non-luminous intermediate layer therebetween. The intermediate layer may serve as a hole blocking layer or an electron blocking layer.

As illustrated in FIGS. 1 to 4, the organic functional layer unit 3 may include the two organic functional layer units 3A and 3B, or the three organic functional layer units 3C, 3D, and 3E. The organic functional layer unit 3 may emit light L of a single color or light L of different colors.

<<Sequence of Organic Functional Layer Unit>>

Now will be described the sequence of two or more organic functional layer units each including at least one of a blue light-emitting layer, a green light-emitting layer, and a red light-emitting layer.

The organic EL element of the present invention preferably includes at least two organic functional layer units 3. The sequence of organic functional layer units 3 will be described with reference to the organic EL elements 100 to 400 each including two or more organic functional layer units 3; i.e., the organic EL element 100 or 300 including two organic functional layer units, or the organic EL element 200 or 400 including three organic functional layer units.

In the organic EL element 100 shown in FIG. 1 and including two organic functional layer units 3, the intermediate electrode layer unit 4A is disposed between the first organic functional layer unit 3A and the second organic functional layer unit 3B. In the tandem organic EL element 300 shown in FIG. 3, the first organic functional layer unit 3A is directly bonded to the second organic functional layer unit 3B.

Thus, the organic EL element having the configuration shown in FIG. 1, which includes the intermediate electrode layer 4 containing elemental silver as a main component, exhibits high power efficiency, long emission lifetime, toning suitability, and excellent light distribution characteristics (viewing angle dependence). If the organic EL element includes two luminous layers, one organic functional layer unit 3 may include a single luminous layer or a plurality of luminous layers. For example, the first organic functional layer unit 3A may include a red light-emitting layer and a green light-emitting layer, and the second organic functional layer unit 3B may include a blue light-emitting layer.

In the organic EL element 200 shown in FIG. 2 and including three organic functional layer units 3, the first intermediate electrode layer 4B is disposed between the first organic functional layer unit 3C and the second organic functional layer unit 3D, and the second intermediate electrode layer 4C is disposed between the second organic functional layer unit 3D and the third organic functional layer unit 3E. In the tandem organic EL element 400 shown in FIG. 4, the first organic functional layer unit 3C, the second organic functional layer unit 3D, and the third organic functional layer unit 3E are directly bonded together.

Each of the organic EL elements 100 to 400 shown above in FIGS. 1 to 4 satisfies the following expression: $\Delta Exy \geq 0.05$ wherein 0° is an angle orthogonal to the surface of the transparent substrate 1 and $\Delta Exy$ represents a chromaticity difference of a reflected color measured at a tilted angle within a range of 0 to 80° with respect to the surface of the transparent substrate.

The chromaticity difference $\Delta Exy$ is calculated as described below.

Figure 5:
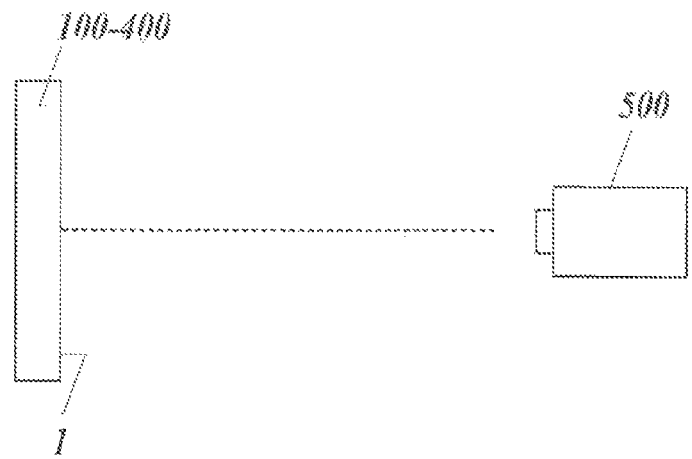
FIG. 5 is a schematic side view illustrating the positional relationship between an organic EL element and a chromaticity meter.

As illustrated in FIGS. 5 (side view) and 6 (plan view), a chromaticity meter 500 is disposed at an angle of 0°; i.e., on an axis orthogonal to the surface of the transparent substrate 1 of each of the organic EL elements 100 to 400. The reference surface of the transparent substrate 1, through which light is extracted, corresponds to the lower surface of the transparent substrate 1 shown in FIGS. 1 to 4.

Subsequently, as illustrated in FIG. 7, each of the organic EL elements 100 to 400 is fixed, and the chromaticity meter 500 is tilted by an angle θ from the axis orthogonal to the reference surface of the transparent substrate 1 in a horizontal direction (x-direction) and a vertical direction (y-direction). Chromaticities of the reflected color at a tilt angle θ are measured in the two directions, to determine xθ and yθ. The value x0 or y0 corresponds to a chromaticity measured at a tilt angle θ of 0°.

The tilt angle θ is varied within a range of 0 to 80° in both x- and y-directions.

The chromaticity meter 500 used is a chromameter CS-100A (manufactured by KONICA MINOLTA, INC.).

Thereafter, $\Delta Exy\theta$ is calculated from the determined x0, y0, xθ, and yθ by Expression 1:

$$\Delta Exy\theta = [(x\theta - x0)^2 + (y\theta - y0)^2]^{1/2} \quad \text{Expression 1:}$$

where $\Delta Exy$ corresponds to the maximum $\Delta Exy\theta$.

Each of the organic EL elements 100 to 400 satisfies the following expression: $\Delta Exy \geq 0.05$ during both non-emission and emission modes of light.

In each of the organic EL elements 100 to 400, a microresonance effect occurs because of the configuration including the organic functional layer unit disposed between the first electrode 2 (transparent electrode) and the second electrode 6 (reflective electrode). This effect leads to an increase in emission intensity and an improvement in angular dependence of spectra, resulting in viewing angle dependence (i.e., different colors of emitted light at different observation angles).

Thus, each of the organic EL elements 100 to 400 exhibits different hues at different observation angles during both emission and non-emission modes of light, and produces an emission pattern which has not yet been achieved by conventional white light-emitting devices.

The condition $\Delta Exy \geq 0.05$ is achieved by formation of the first electrode 2 on the transparent substrate 1, preferably, formation of the second electrode 2 and the organic functional layer unit 3 on the transparent substrate 1, more preferably, formation of the second electrode 2, the organic functional layer unit 3, and the second electrode 6 on the transparent substrate 1.

<<Production of Organic EL Element>>

A method for producing the organic EL element includes the following steps:

(1) a step of forming a preform of an element, and
(2) a step of irradiating a specific region of the preform with light.

Now will be described a method for producing the organic EL element 100 shown in FIG. 1.

(1) Step of Forming Preform

In this step, a preform is formed by depositing, on a transparent substrate 1, a first electrode 2 (transparent electrode), a first organic functional layer unit 3A, an intermediate electrode layer unit 4A (including an intermediate electrode 41A and an underlying layer 41B), a second organic functional layer unit 3B, and a second electrode 6 (counter electrode) in sequence.

Specifically, a transparent substrate 1 is provided, and the transparent substrate 1 is coated with elemental silver (or an alloy containing silver as a main component) by an appropriate process, such as vapor deposition, to form a first electrode 2. In parallel therewith, a lead line is connected to an end of the first electrode 2.

Subsequently, a hole injecting layer, a hole transporting layer, a luminous layer, an electron transporting layer, and an electron injecting layer are disposed in sequence on the first electrode 2, to form a first organic functional layer unit 3A.

Each of these layers is formed by any process, such as spin coating, casting, ink jetting, vapor deposition, or printing. A vacuum deposition or spin coating process is preferably used for forming a homogeneous layer and preventing formation of pinholes.

The respective layers of the first organic functional layer unit 3A may be formed by different processes.

Subsequently, an underlying layer 41B and an intermediate electrode 41A are disposed in sequence on the first organic functional layer unit 3A, to form an intermediate electrode layer unit 4A.

Specifically, the uppermost layer (electron injecting layer) of the first organic functional layer unit 3A is coated with a nitrogen atom-containing nitrogen compound by an appropriate process, such as vapor deposition, to form the underlying layer 41B. As in the first electrode 2, the underlying layer 41B is coated with elemental silver (or an alloy containing silver as a main component) by an appropriate process, such as vapor deposition, to form the intermediate electrode 41A. In parallel therewith, a lead line is connected to an end of the intermediate electrode 41A.

As in the first organic functional layer unit 3A, a second organic functional layer unit 3B is then formed on the intermediate electrode 41A of the intermediate electrode layer unit 4A.

Subsequently, a second electrode 6 is formed on the uppermost layer (electron injecting layer) of the second organic functional layer unit 3B by an appropriate process, such as vapor deposition or sputtering. In parallel therewith, a lead line is connected to an end of the second electrode 6.

Thereafter, a sealing member is preferably provided on the transparent substrate 1 such that the lead lines connected to the first electrode 2, the intermediate electrode 41A, and the second electrode 6 are exposed to the outside, for sealing of the first organic functional layer unit 3A and the second organic functional layer unit 3B.

The preform of the element formed through the aforementioned step satisfies the expression $\Delta Exy \geq 0.05$. As described above, such a condition $\Delta Exy \geq 0.05$ is achieved by formation of the first electrode 2 on the transparent substrate 1, preferably, formation of the second electrode 2 and the first organic functional layer unit 3A on the transparent substrate 1, more preferably, formation of the second electrode 2, the first organic functional layer unit 3A, the intermediate electrode layer unit 4A, and the second organic functional layer unit 3B on the transparent substrate 1.

(2) Irradiation Step with Light

In this step, a specific pattern region of the preform of the element is irradiated with light, to transform the irradiated portion into a non-luminous region. Thus, the first organic functional layer unit 3A and the second organic functional layer unit 3B are deprived of their emission functions in the light-irradiated region, to produce the organic EL element 100 exhibiting a specific emission pattern.

Irradiation with light may be carried out by any process which can transform a specific pattern region of the organic functional layer unit 3 into a non-luminous region.

Light for irradiation contains at least UV rays, and may also contain visible rays or infrared rays. As used herein, the term "UV rays" refers to electromagnetic waves having a wavelength longer than that of X-rays and shorter than the shortest wavelength of visible rays; specifically, having a wavelength of 1 to 400 nm.

If the transparent substrate 1 is composed of a resin film, the substrate is preferably irradiated with light not containing a wavelength component of 340 nm or shorter. The "light not containing a wavelength component of 340 nm or shorter" refers to light which has passed through an optical filter capable of transmitting 50% or less light having a wavelength of 340 nm or shorter (cutoff wavelength: 340 nm). If the substrate is irradiated with a laser beam, the "light not containing a wavelength component of 340 nm or shorter" refers to a laser beam having a wavelength of longer than 340 nm and 400 nm or shorter.

UV rays may be generated and applied by any known device (light source).

Specific examples of the light source include high-pressure mercury lamps, low-pressure mercury lamps, hydrogen (deuterium) lamps, rare gas (e.g., xenon, argon, helium, or neon) discharge lamps, nitrogen lasers, excimer lasers (e.g., XeCl, XeF, KrF, and KrCl), hydrogen lasers, halogen lasers, and visible (LD)-infrared laser harmonics (e.g., third harmonic generation (THG) light of YAG laser).

A pattern region of the first organic functional layer unit 3A and the second organic functional layer unit 3B may be irradiated with light not containing a wavelength component of 340 nm or shorter by any process which can transform the irradiated portion into a non-luminous region.

Specific examples of the process include irradiation with a laser beam containing a wavelength component of longer than 340 nm and 400 nm or shorter, and irradiation with light from a source, the light that has passed through an optical filter which absorbs a wavelength component of 340 nm or shorter. The optical filter may be, for example, a UV-absorbing filter manufactured by Isuzu Glass Ltd.

For irradiation of a pattern region with a laser beam containing a wavelength component of longer than 340 nm, the laser beam is applied onto specific spots of the first organic functional layer unit 3A and the second organic functional layer unit 3B, and the first organic functional layer unit 3A and the second organic functional layer unit 3B are then scanned by the laser beam through relative displacement of the layer units and the laser beam source.

For irradiation of a pattern region with light that has passed through an optical filter, a region (other than the pattern region) of the first organic functional layer unit 3A and the second organic functional layer unit 3B is shielded with a mask, and the entire pattern region of the first organic functional layer unit 3A and the second organic functional layer unit 3B is irradiated with light that has passed through the optical filter.

Irradiation with light is preferably performed after the sealing process in the step of forming the preform.

If the second electrode 6 does not have translucency, light is applied onto the light extraction surface (lower surface in FIG. 1) of the transparent substrate 1. In this case, the first organic functional layer unit 3A and the second organic functional layer unit 3B are irradiated with light through the transparent substrate 1, which absorbs a certain amount of light. Thus, irradiation with light is performed for a sufficient period of time.

If the transparent substrate 1 is composed of a resin film, a non-luminous region is formed by irradiating the layer units with light not containing a wavelength component of 340 nm or shorter without causing discoloration of the transparent substrate 1. Thus, irradiation with light can be performed for a sufficient period of time without degradation of the quality of the resultant organic EL element 100.

Irradiation with light, which is followed by the sealing process, is not necessarily performed in a closed system (e.g., in a chamber); i.e., the sealed element can be exposed to air (open system). Thus, the organic EL element 100, which exhibits a specific emission pattern, is produced through a simple process at low cost.

Irradiation with light may be performed before the sealing process. Alternatively, irradiation with light may be performed after formation of the first organic functional layer unit 3A and the second organic functional layer unit 3B and before formation of the second electrode 6 in the preform forming step. In this case, the transparent substrate 1 may be irradiated with light, or the second organic functional layer unit 3B may be irradiated with light.

In the light irradiation step, the luminance of a light-irradiated portion can be adjusted by varying the amount of light for irradiation under control of the intensity of light or the irradiation time. An increase in amount of light for irradiation leads to a reduction in luminance of a light-irradiated portion; i.e., a small amount of light for irradiation results in low percentage of reduction in luminance. That is, no irradiation with light (amount of light for irradiation=zero) leads to the maximum luminance.

Thus, the resultant organic EL element 100 is provided with a luminance contrast. The luminance contrast can be varied by adjustment of a driving current. Although a reduction in luminance leads to an increase in driving voltage, the luminance-voltage property is stable over time. Thus, the organic EL element 100 emits light with luminance contrast.

The organic EL element 100 exhibiting a desired emission pattern is produced through the aforementioned steps.

The organic EL element 100 is preferably produced by forming the aforementioned components (from the first organic functional layer unit 3A to the second electrode 6) through a single vacuuming process. The vacuuming process may be intermitted, and the transparent substrate 1 may be removed from the vacuum chamber, followed by a process (other than the vacuuming process) for forming the components. In such a case, the process is carried out in a dry inert gas atmosphere, for example.

<<Components of Organic EL Element>>

Components of the organic EL element and a method for producing the element will now be described in detail.

[Transparent Substrate]

The transparent substrate 1 used for the organic EL element of the present invention may be composed of a transparent material, such as glass or plastic material. The transparent substrate 1 is preferably composed of, for example, glass, quartz, or resin film.

Examples of the glass material include silica glass, soda-lime silica glass, lead glass, borosilicate glass, and alkali-free glass. Such a glass material may optionally be subjected to a physical treatment (e.g., polishing) or coated with an inorganic film, an organic film, or an inorganic-organic hybrid film, in view of adhesion of the substrate to the adjacent layer, or the durability or smoothness of the substrate.

Examples of the material for the resin film include polyesters, such as poly(ethylene terephthalate) (PET) and poly(ethylene naphthalate) (PEN), polyethylene, polypropylene, cellophane, cellulose esters and their derivatives, such as cellulose diacetate, cellulose triacetate (TAC), cellulose acetate butyrate, cellulose acetate propionate (CAP), cellulose acetate phthalate, and cellulose nitrate, poly(vinylidene chloride), poly(vinyl alcohol), poly(ethylene-vinyl alcohol), syndiotactic polystyrene, polycarbonates, norbornene resins, polymethylpentene, polyether ketones, polyimides, polyethersulfone (PES), poly(phenylene sulfide), polysulfones, polyether imides, polyether ketone imides, polyamides, fluororesins, nylon, poly(methyl methacrylate), acrylic resins, polyarylates, and cycloolefin resins, such as ARTON (trade name, manufactured by JSR Corp.) and APEL (trade name, manufactured by Mitsui Chemicals Inc.).

The surface of the transparent substrate 1 is preferably cleaned through a surface activation treatment. Examples of the surface activation treatment include corona treatment, plasma treatment, and flame treatment.

[Gas Barrier Layer]

The organic EL element of the present invention may optionally include a gas barrier layer disposed on the transparent substrate 1.

The transparent substrate 1 having the gas barrier layer preferably has a water vapor transmission rate ($25\pm0.5°$ C., relative humidity ($90\pm2$)% RH) of $1\times10^{-3}$ g/m$^2\cdot$24 h or less as determined in accordance with JIS K 7129-1992. The transparent substrate 1 more preferably has an oxygen transmission rate of $1\times10^{-3}$ mL/m$^2\cdot$24 h·atm (1 atm=1.01325×105 Pa) or less as determined in accordance with JIS K 7126-1987 and a water vapor transmission rate ($25\pm0.5°$ C., relative humidity ($90\pm2$)% RH) of $1\times10^{-3}$ g/m$^2\cdot$24 h or less.

The gas barrier layer may be composed of any material capable of preventing intrusion of a substance which causes degradation of the organic EL element, such as moisture or oxygen. Examples of the material include inorganic materials, such as silicon oxide, silicon dioxide, and silicon nitride. In view of enhancement of the strength, the gas barrier layer preferably has a laminate structure composed of an inorganic layer and an organic material layer. The inorganic layer and the organic layer may be disposed in any order. Preferably, two or more inorganic layers and two or more organic layers are alternately disposed.

The gas barrier layer may be formed by any known thin film forming process. Examples of the process include vacuum deposition, sputtering, reactive sputtering, molecular beam epitaxy, the ionized-cluster beam method, ion plating, plasma polymerization, atmospheric pressure plasma polymerization, plasma CVD, laser CVD, thermal CVD, and coating. The gas barrier layer is preferably formed through atmospheric pressure plasma polymerization as described in Japanese Unexamined Patent Application Publication No. 2004-68143. In another preferred process, a polysilazane-containing solution is wet-applied onto a substrate to prepare a coating film, and the coating film is dried and then modified through irradiation with vacuum UV light (VUV light) of 200 nm or shorter, to form a gas barrier layer.

The gas barrier layer preferably has a thickness of 1 to 500 nm, more preferably 10 to 300 nm. A gas barrier layer having a thickness of 1 nm or more exhibits desired gas barrier properties, whereas a gas barrier layer having a thickness of 500 nm or less precludes degradation (e.g., cracking) of a dense silicon oxynitride film.

[First Electrode]

In the present invention, the first electrode 2 (transparent electrode) disposed on one surface of the transparent substrate 1 serves as an anode.

In a preferred embodiment, the first electrode 2 is a very thin film composed of elemental metal or a metal-based alloy such that the electrode exhibits light transmittance and plasmon loss does not occur at the surface irradiated with light. Specifically, the first electrode 2 preferably has a light transmittance of 60% or more at 550 nm, a thickness of 1 to 30 nm, and a sheet resistance of 0.0001 to 50 Ω/square (more preferably 0.01 to 30 Ω/square).

The transparent electrode is generally composed of an oxide semiconductor, such as indium tin oxide (SnO$_2$—In$_2$O$_3$:ITO). Unfortunately, ITO, which contains indium (i.e., a rare metal), is expensive and requires annealing at about 300° C. after formation of a film for reducing resistance. Thus, attempts have been made to form the transparent electrode from a thin layer of a metal having high conductivity (e.g., silver) or from a conductive layer of a silver-aluminum mixture having a thickness smaller than that of the silver layer.

If the first electrode 2 serves as an anode in the organic EL element, the first electrode 2 is preferably composed of a substance having a high work function (4 eV or more), such as a metal, an alloy, a conductive compound, or a mixture thereof.

In view of the advantageous effects of the present invention; i.e., different hues at different observation angles during non-emission of light, the first electrode 2 preferably includes a layer composed of elemental silver or a silver-based alloy. More preferably, the first electrode 2 includes a metal layer composed of elemental silver or a silver-based alloy and a nitrogen-containing layer adjacent to the metal layer. The nitrogen-containing layer is composed of a compound containing nitrogen atoms and satisfying the following expression: $2.0 \times 10^{-3} \leq [n/M]$ ([n/M]: effective unshared electron pair content) wherein n represents the number of non-aromatic unshared electron pairs of the nitrogen atoms, and M represents the molecular weight of the compound.

The nitrogen-containing layer contains a compound having a structure represented by Formula (1):

[F2]

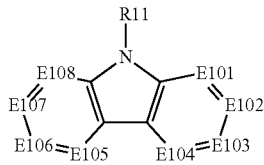

General Formula (1)

wherein E101 to E108 each represent —C(R12)= or —N=, at least one of E101 to E108 is —N=, and R11 and R12 each represent a hydrogen atom or a substituent.

Examples of the substituent include alkyl groups (e.g., methyl, ethyl, propyl, isopropyl, tert-butyl, pentyl, hexyl, octyl, dodecyl, tridecyl, tetradecyl, and pentadecyl), cycloalkyl groups (e.g., cyclopentyl and cyclohexyl), alkenyl groups (e.g., vinyl and allyl), alkynyl groups (e.g., ethynyl and propargyl), aromatic hydrocarbon groups (also referred to as aromatic carbon groups or aryl groups, such as phenyl, p-chlorophenyl, mesityl, tolyl, xylyl, naphthyl, anthryl, azulenyl, acenaphthenyl, fluorenyl, phenanthryl, indenyl, pyrenyl, and biphenylyl), aromatic heterocyclic groups (e.g., furyl, thienyl, pyridyl, pyridazinyl, pyrimidinyl, pyrazinyl, triazinyl, imidazolyl, pyrazolyl, thiazolyl, quinazolinyl, carbazolyl, carbolinyl, diazacarbazolyl (a group wherein one of the carbon atoms forming the carboline ring of the carbolinyl group is substituted by a nitrogen atom), and phthalazinyl), heterocyclic groups (e.g., pyrrolidyl, imidazolidyl, morpholyl, and oxazolidyl), alkoxy groups (e.g., methoxy, ethoxy, propyloxy, pentyloxy, hexyloxy, octyloxy, and dodecyloxy), cycloalkoxy groups (e.g., cyclopentyloxy and cyclohexyloxy), aryloxy groups (e.g., phenoxy and naphthyloxy), alkylthio groups (e.g., methylthio, ethylthio, propylthio, pentylthio, hexylthio, octylthio, and dodecylthio), cycloalkylthio groups (e.g., cyclopentylthio and cyclohexylthio), arylthio groups (e.g., phenylthio and naphthylthio), alkoxycarbonyl groups (e.g., methyloxycarbonyl, ethyloxycarbonyl, butyloxycarbonyl, octyloxycarbonyl, and dodecyloxycarbonyl), aryloxycarbonyl groups (e.g., phenyloxycarbonyl and naphthyloxycarbonyl), sulfamoyl groups (e.g., aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl), acyl groups (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl), acyloxy groups (e.g., acetyloxy, ethylcarbonyloxy, butylcarbonyloxy, octylcarbonyloxy, dodecylcarbonyloxy, and phenylcarbonyloxy), amido groups (e.g., methylcarbonylamino, ethylcarbonylamino, dimethylcarbonylamino, propylcarbonylamino, pentylcarbonylamino, cyclohexylcarbonylamino, 2-ethyhexylcarbonylamino, octylcarbonylamino, dodecylcarbonylamino, phenylcarbonylamino, and naphthylcarbonylamino), carbamoyl groups (e.g., aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl), ureido groups (e.g., methylureido, ethylureido, pentylureido, cyclohexylureido, octylureido, dodecylureido, phenylureido, naphthylureido, and 2-pyridylaminoureido), sulfinyl groups (e.g., methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl), alkylsulfonyl groups (e.g., methylsulfonyl, ethylsulfonyl, butylsulfonyl, cyclohexylsulfonyl, 2-ethylhexylsulfonyl, and dodecylsulfonyl), arylsulfonyl and heteroarylsulfonyl groups (e.g., phenylsulfonyl, naphthylsulfonyl, and 2-pyridylsulfonyl), amino groups (e.g., amino, ethylamino, dimethylamino, butylamino, cyclopentylamino, 2-ethylhexylamino, dodecylamino, anilino, naphthylamino, 2-pyridylamino, piperidyl (also referred to as piperidinyl), and 2,2,6,6-tetramethylpiperidinyl), halogen atoms (e.g., fluorine, chlorine, and bromine), fluorohydrocarbon groups (e.g., fluoromethyl, trifluoromethyl, pentafluoromethyl, and pentafluorophenyl), a cyano group, a nitro group, a hydroxy group, a mercapto group, silyl groups (e.g., trimethylsilyl, triisopropylsilyl, triphenylsilyl, and phenyldiethylsilyl), phosphate ester groups (e.g., dihexylphosphoryl), phosphite ester groups (e.g., diphenylphosphinyl), and a phosphono group.

Such a substituent may further have any of the aforementioned substituents. These substituents may together form a ring.

The first electrode (transparent electrode) is preferably composed of silver having a purity of 99% or more. The first electrode may contain, for example, palladium (Pd), copper (Cu), or gold (Au) for maintaining the stability of silver.

If the transparent electrode is composed of a silver-based alloy, the silver content of the alloy is preferably 50% or more. Examples of the alloy include silver-magnesium (AgMg), silver-copper (AgCu), silver-palladium (AgPd), silver-palladium-copper (AgPdCu), silver-indium (AgIn), silver-gold (AgAu), silver-aluminum (AgAl), silver-zinc (AgZn), silver-tin (AgSn), silver-platinum (AgPt), silver-titanium (AgTi), and silver-bismuth (AgBi).

The first electrode 2 (transparent electrode) has a thickness of preferably 1 to 30 nm, more preferably 3 to 20 nm. A thickness within the above preferred range leads to a reduction in amount of a light-absorbing or light-reflecting component in the electrode, resulting in maintenance of light transmittance. This preferred range also leads to maintenance of conductivity.

The transparent electrode can be formed by a wet process, such as coating, ink jetting, or dipping, or a dry process, such as vapor deposition (e.g., resistance heating or EB process), sputtering, or CVD. In particular, the transparent electrode is preferably formed through vapor deposition. A nitrogen atom-containing layer, serving as an underlying layer, may be disposed between the transparent electrode and the transparent substrate. Although the transparent electrode, which is composed of elemental silver or a silver-based alloy, exhibits sufficiently high conductivity without being annealed, the electrode may optionally be subjected to annealing at a high temperature.

The aforementioned transparent electrode may optionally include a plurality of silver layers or silver-based alloy layers. Specifically, the transparent electrode may include alternately disposed silver layers and silver-based alloy layers, or may include different types of silver-based alloy layers. If the intermediate electrode layer 4 has a two-layer structure, a silver layer may be disposed on each of the underlying layers 41, 42, and 43 with an aluminum (Al) layer therebetween. In such a case, the aluminum layer is not necessarily a continuous layer, but may be a layer having an island pattern or holes.

The transparent electrode may be formed from a coatable material (e.g., an organic conductive compound) by a wet process, such as printing or coating.

[Intermediate Electrode]

Each of the organic EL elements 100 and 200 of the present invention includes two or more organic functional layer units 3 between the first electrode 2 and the second electrode 6, and these organic functional layer units 3 are separated by at least one intermediate electrode unit 4 (unit 4A or units 4B and 4C) having an independent connection terminal for achieving electrical connection.

As in the transparent electrode described above, the intermediate electrode of the intermediate electrode layer unit 4 according to the present invention is preferably composed of a metal or an alloy containing the metal as a main component, more preferably composed of elemental silver or a silver-based alloy.

[Underlying Layer]

Each of the organic EL elements 100 and 200 of the present invention preferably includes an underlying layer 41, 42, or 43 on at least one surface of the intermediate electrode layer unit 4, the underlying layer containing a nitrogen atom-containing compound.

The underlying layer may be composed of any material. If the intermediate electrode is an electrode layer composed of elemental silver or a silver-based alloy, the underlying layer may be composed of any material which can prevent aggregation of silver, such as a nitrogen atom- or sulfur atom-containing compound.

The underlying layer 41, 42, or 43 may be composed of any compound containing a nitrogen atom in the molecule, but is preferably composed of a compound having a heterocylic ring containing a nitrogen atom as a heteroatom. Examples of the heterocylic ring containing the nitrogen atom as the heteroatom include aziridine, azirine, azetidine, azete, azolidine, azolidine, azole, azinane, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-C-cinnoline, porphyrin, chlorin, and choline.

The nitrogen atom-containing compound contained in the underlying layer 41, 42, or 43 is preferably an aromatic heterocyclic compound containing a nitrogen atom having a non-aromatic unshared electron pair.

As used herein, the "nitrogen atom having a non-aromatic unshared electron pair" (also called "lone electron pair") refers to a nitrogen atom having an unshared electron pair that is not essential or directly responsible for the aromaticity of an unsaturated cyclic compound; specifically, a nitrogen atom having an unshared electron pair that is not essential or responsible for delocalized π-electrons on a conjugated unsaturated ring (aromatic ring) structure for expression of the aromaticity of the chemical structure.

As used herein, the term "aromaticity" refers to the case where the number of electrons is $4n+2$ (n is 0 or a natural number) in a delocalized π-electron system on a conjugated (resonance) unsaturated ring structure composed of atoms having π-electrons (i.e., Hueckel's rule). For example, the nitrogen atom of pyridine or the nitrogen atom of an amino group as a substituent corresponds to a "nitrogen atom having a non-aromatic unshared electron pair."

The aromatic heterocyclic compound contained in the nitrogen atom-containing layer may have any structure containing, in the molecule, a nitrogen atom having a non-aromatic unshared electron pair. The aromatic heterocyclic compound preferably has a pyridine ring in the molecule, more preferably has an azacarbazole ring, an azadibenzofuran ring, or an azadibenzothiophene ring in the molecule, much more preferably has a γ,γ'-diazacarbazole ring or a σ-carboline ring in the molecule.

The underlying layer may be composed of an organic sulfur atom-containing compound in place of any of the aforementioned nitrogen atom-containing compounds. The organic sulfur atom-containing compound used for the underlying layer preferably has a sulfide bond (also referred to as "thioether bond"), a disulfide bond, a mercapto group, a sulfone group, or a thiocarbonyl bond in the molecule, in particular, a sulfide bond or a mercapto group in the molecule.

The underlying layer may be composed of a sulfur atom-containing polymer. The sulfur atom-containing polymer preferably has a weight average molecular weight of 1,000 to 1,000,000.

The underlying layer 41, 42, or 43 containing a nitrogen atom-containing layer can be formed by a wet process, such as coating, ink jetting, or dipping, or a dry process, such as vapor deposition (e.g., resistance heating or EB process), sputtering, or CVD. In particular, the underlying layer is preferably formed through vapor deposition.

If a plurality of compounds are used for the underlying layer 41, 42, or 43, the layer is formed by a co-deposition process in which these compounds are simultaneously supplied from the corresponding deposition sources, or a process in which the compounds are sequentially deposited. Specifically, the underlying layer 41, 42, or 43 is formed through co-deposition or sequential deposition of any of the aforementioned compounds used for the underlying layer and, for example, potassium fluoride or lithium fluoride. If the underlying layer is formed from a polymer compound, a coating process is preferably used. In such a case, the coating process involves use of a coating solution prepared by dissolving the compound in a solvent. Any solvent may be used which can dissolve the compound. If the nitrogen atom-containing underlying layer 41, 42, or 43 is formed from a plurality of compounds, a coating solution is prepared with a solvent which can dissolve the compounds.

[Organic Functional Layer Unit]

Next will be sequentially described the charge injecting layer, luminous layer, hole transporting layer, electron transporting layer, and blocking layer of the organic functional layer unit 3.

(Charge Injecting Layer)

The charge injecting layer will now be described.

The charge injecting layer is provided between the electrode and the luminous layer for a reduction in driving voltage or an increase in luminance. The charge injecting layer is detailed in Chapter 2 "Electrode Materials" (pp. 123-166) of Part 2 of "Organic EL element and its forefront of industrialization (published by NTS Corporation, Nov. 30, 1998)." The charge injecting layer is classified into a hole injecting layer and an electron injecting layer.

In general, the hole injecting layer is disposed between an anode and a luminous layer or a hole transporting layer, and the electron injecting layer is disposed between a cathode and a luminous layer or an electron transporting layer.

The hole injecting layer is disposed adjacent to the transparent electrode (anode) for a reduction in driving voltage or an increase in luminance. The hole injecting layer is detailed in Chapter 2 "Electrode Materials" (pp. 123-166) of Part 2 of "Organic EL element and its forefront of industrialization (published by NTS Corporation, Nov. 30, 1998)."

The hole injecting layer is also detailed in Japanese Unexamined Patent Application Publication Nos. H9-45479, H9-260062, and H8-288069. Examples of the material for the hole injecting layer include derivatives of porphyrin, phthalocyanine, oxazole, oxadiazole, triazole, imidazole, pyrazoline, pyrazolone, phenylenediamine, hydrazine, stilbene, polyarylalkane, triarylamine, carbazole, indolocarbazole, isoindole, acene, such as anthracene and naphthalene, fluorene, and fluorenone, poly(vinylcarbazole), polymer materials and oligomers having an aromatic amine in the main chain or side chain, polysilanes, and conductive polymers and oligomers (e.g., poly(ethylenedioxythiophene) (PEDOT), poly(styrenesulfonic acid) (PSS), aniline copolymers, polyaniline, and polythiophene).

Examples of the triarylamine derivatives include benzidine derivatives, such as 4,4'-bis[N-(1-naphthyl)-N-phenylamino]biphenyl (α-NPD), starburst amine derivatives, such as 4,4',4"-tris[N-(3-methylphenyl)-N-phenylamino]triphenylamine (MTDATA), and compounds having fluorine or anthracene on the bonding cores of tryarylamines.

The hole transporting material may also be hexaazatriphenylene derivatives described in Japanese Translation of PCT International Application Publication No. 2003-519432 and Japanese Unexamined Patent Application Publication No. 2006-135145.

The electron injecting layer is provided between the cathode and the luminous layer for a reduction in driving voltage or an increase in luminance. If the cathode is a transparent electrode, the electron injecting layer is disposed adjacent to the transparent electrode. The electron injecting layer is detailed in Chapter 2 "Electrode Materials" (pp. 123-166) of Part 2 of "Organic EL element and its forefront of industrialization (published by NTS Corporation, Nov. 30, 1998)."

The electron injecting layer is also detailed in Japanese Unexamined Patent Application Publication Nos. H6-325871, H9-17574, and H10-74586. Specific examples of materials preferably used for the electron injecting layer include metals, such as strontium and aluminum, alkali metal compounds, such as lithium fluoride, sodium fluoride, and potassium fluoride, alkali metal halide layer such as magnesium fluoride, and calcium fluoride, alkaline earth metal compound layer, such as magnesium fluoride, metal oxides, such as molybdenum oxide and aluminum oxide, and metal complexes, such as lithium 8-hydroxyquinolate (Liq). If the transparent electrode serves as a cathode, the electron injecting layer is preferably composed of an organic material, such as a metal complex. The electron injecting layer preferably has a very small thickness. The thickness of the electron injecting layer, which may vary with the material thereof, is preferably 1 nm to 10 μm.

(Luminous Layer)

The luminous layer of the organic functional layer unit 3 of the organic EL element of the present invention preferably contains a phosphorescent compound (i.e., a luminous material).

The luminous layer emits light through recombination of electrons injected from the electrode or the electron transporting layer and holes injected from the hole transporting layer. A light-emitting portion may be located within the luminous layer or at the interface between the luminous layer and the adjacent layer.

The luminous layer may have any configuration, so long as it contains a luminous material satisfying the requirements for emission. The luminous layer may include a plurality of luminous layers each having a single emission spectrum or a maximum emission wavelength. In such a case, a non-luminous intermediate layer is preferably disposed between the luminous layers.

The total thickness of the luminous layer is preferably 1 to 100 nm, more preferably 1 to 30 nm in view of a reduction in driving voltage. If a non-luminous intermediate layer is disposed between luminous layers, the total thickness of the luminous layer includes the thickness of the intermediate layer.

In the present invention, the luminous layer basically includes two or more luminous layer units. Each luminous layer has a thickness of preferably 1 to 50 nm, more preferably 1 to 20 nm. If the luminous layers correspond to blue, green, and red light-emitting colors, each of the blue, green, and red light-emitting layers may have any thickness.

The aforementioned luminous layer may be formed from a luminous material or host compound described below by any known process, such as vacuum deposition, spin coating, casting, Langmuir-Blodgett (LB) deposition, or ink jetting.

The luminous layer may contain a plurality of luminous materials; for example, a phosphorescent material and a fluorescent material (also referred to as "fluorescent dopant" or "fluorescent compound"). The luminous layer preferably contains a host compound (also referred to as "luminous host") and a luminous material (also referred to as "luminous dopant compound") that emits light.

<Host Compound>

The host compound contained in the luminous layer has a phosphorescent quantum yield of preferably less than 0.1 at room temperature (25° C.), more preferably less than 0.01. The host compound is contained in the luminous layer in an amount of preferably 50% or more by volume.

The luminous layer may contain a single known host compound, or a plurality of host compounds. The use of a plurality of host compounds enables control of charge migration, and provides the organic electroluminescent element with high efficiency. The use of a plurality of luminous materials described below achieves mixing of different colors of light, resulting in emission of light of any color.

The host compound used in the luminous layer may be any known low-molecular-weight compound, a polymer compound having repeating units, or a low-molecular-weight compound having a polymerizable group, such as a vinyl or epoxy group (polymerizable luminous host for deposition).

Preferred known host compounds have hole or electron transportability, can prevent emission of light having a long wavelength, and have a high glass transition point (Tg) as determined by differential scanning colorimetry (DSC) in accordance with JIS-K-7121.

Specific examples of the host compound applicable to the present invention include those described in Japanese Unexamined Patent Application Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837, U.S. Patent Application Publication Nos. 2003/0175553, 2006/0280965, 2005/0112407, 2009/0017330, 2009/0030202, and 2005/238919, International Patent Publication WO2001/039234, WO2009/021126, WO2008/056746, WO2004/093207, WO2005/089025, WO2007/063796, WO2007/063754, WO2004/107822, WO2005/030900, WO2006/114966, WO2009/086028, WO2009/003898, and WO2012/023947, Japanese Unexamined Patent Application Publication Nos. 2008-074939 and 2007-254297, and EP No. 2034538.

<Luminous Material>

The luminous material used in the present invention may be a phosphorescent compound (also referred to as "phosphorescent material") or a fluorescent compound (also referred to as "fluorescent material").

<Phosphorescent Compound>

The phosphorescent compound emits light from the excited triplet state. Specifically, the phosphorescent compound is defined as a compound which emits phosphorescent light at room temperature (25° C.) and has a phosphorescent quantum yield of 0.01 or more at 25° C. The preferred phosphorescent quantum yield is 0.1 or more.

The phosphorescent quantum yield is determined by the method described in page 398 of Bunko II of Jikken Kagaku Koza 7 (Spectroscopy II, Experimental Chemistry 7) (4th Edition, 1992, published by Maruzen Company, Limited). The phosphorescent quantum yield in a solution can be determined with any suitable solvent. The phosphorescent compound used in the present invention has a phosphorescent quantum yield of 0.01 or more determined with any appropriate solvent.

The phosphorescent compound can emit light on the basis of one of the following two mechanisms. One emission mechanism is based on energy transfer, which involves recombination of carriers on a host compound onto which the carriers are transferred to produce an excited state of the host compound, and then light emission from the phosphorescent compound through transfer of this energy to the phosphorescent compound. The other emission mechanism is based on a carrier trap, in which the phosphorescent compound serves as a carrier trap to cause recombination of carriers on the phosphorescent compound, resulting in light emission from the phosphorescent compound. In each case, it is essential that the energy in the excited state of the phosphorescent compound be lower than that in the excited state of the host compound.

The phosphorescent compound may be appropriately selected from known ones used for the luminous layer of a common organic EL element. The phosphorescent compound is preferably a complex compound containing a metal belonging to Groups 8 to 10 of the periodic table of elements, more preferably an iridium compound, an osmium compound, a platinum compound (platinum complex compound), or a rare earth complex. Most preferred is an iridium compound.

In the present invention, at least one luminous layer may contain two or more phosphorescent compounds. The phosphorescent compound content in the luminous layer may vary across the thickness of the layer.

Specific examples of known phosphorescent dopants usable in the present invention include compounds described in the following publications.

Examples of compounds are described in Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), International Patent Publication WO2009/100991, WO2008/101842, and WO2003/040257, and U.S. Patent Application Publication Nos. 2006835469, 20060202194, 20070087321, and 20050244673.

Other examples of compounds are described in Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), International Patent Publication WO2009/050290, WO2002/015645, and WO2009/000673, U.S. Patent Application Publication No. 2002/0034656, U.S. Pat. No. 7,332,232, U.S. Patent Application Publication Nos. 20090108737 and 20090039776, U.S. Pat. Nos. 6,921,915 and 6,687,266, U.S. Patent Application Publication Nos. 20070190359, 20060008670, 20090165846, and 20080015355, U.S. Pat. Nos. 7,250,226 and 7,396,598, U.S. Patent Application Publication Nos. 20060263635, 20030138657, and 20030152802, and U.S. Pat. No. 7,090,928.

Other examples of compounds are described in Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), International Patent Publication WO2002/002714, WO2006/009024, WO2006/056418, WO2005/019373, WO2005/123873, WO2005/123873, WO2007/004380, and WO2006/082742, U.S. Patent Application Publication Nos. 2006/0251923 and 20050260441, U.S. Pat. Nos. 7,393,599, 7,534,505, and 7,445,855, U.S. Patent Application Publication Nos. 20070190359 and 20080297033, U.S. Pat. No. 7,338,722, U.S. Patent Application Publication No. 20020134984, U.S. Pat. No. 7,279,704, and U.S. Patent Application Publication Nos. 2006098120 and 2006103874.

Other examples of compounds are described in International Patent Publication WO2005/076380, WO2010/032663, WO2008/140115, WO2007/052431, WO2011/134013, WO2011/157339, WO2010/086089, WO2009/113646, WO2012/020327, WO2011/051404, WO2011/004639, and WO2011/073149, and Japanese Unexamined Patent Application Publication Nos. 2012-069737, 2009-114086, 2003-81988, 2002-302671, and 2002-363552.

In the present invention, the phosphorescent dopant is preferably an organometallic complex containing Ir as a central metal, more preferably a complex containing at least one coordination mode of metal-carbon bond, metal-nitrogen bond, metal-oxygen bond, and metal-sulfur bond.

The aforementioned phosphorescent compound (also referred to as "phosphorescent metal complex") can be synthesized through a process described in, for example, Organic Letter, Vol. 3, No. 16, pp. 2579-2581 (2001), Inorganic Chemistry, Vol. 30, No. 8, pp. 1685-1687 (1991), J. Am. Chem. Soc., Vol. 123, p. 4304 (2001), Inorganic Chemistry, Vol. 40, No. 7, pp. 1704-1711 (2001), Inorganic Chemistry, Vol. 41, No. 12, pp. 3055-3066 (2002), New Journal of Chemistry., Vol. 26, p. 1171 (2002), European Journal of Organic Chemistry, Vol. 4, pp. 695-709 (2004), and references cited in these publications.

<Fluorescent Compound>

Examples of the fluorescent compound include coumarin dyes, pyran dyes, cyanine dyes, croconium dyes, squarylium dyes, oxobenzanthracene dyes, fluorescein dyes, rhodamine dyes, pyrylium dyes, perylene dyes, stilbene dyes, polythiophene dyes, and fluorescent rare earth complexes.

(Hole Transporting Layer)

The hole transporting layer is composed of a hole transporting material which includes a function to transport holes. The hole injecting layer or the electron blocking layer also functions as a hole transporting layer in a broad sense. One or more hole transporting layers may be provided.

The hole transporting material may be an organic or inorganic substance that has hole injecting ability, hole transporting ability, or electron blocking ability. Examples of the hole transporting material include derivatives of triazole, oxadiazole, imidazole, polyarylalkane, pyrazoline, pyrazolone, phenylenediamine, arylamine, amino-substituted chalcone, oxazole, styrylanthracene, fluorenone, hydrazone, stilbene, and silazane, aniline copolymers, conductive higher oligomers, and thiophene oligomers.

The hole transporting material may be any of the aforementioned ones, but is preferably a porphyrin compound, an aromatic tertiary amine compound, or a styrylamine compound, particularly preferably an aromatic tertiary amine compound.

Typical examples of the aromatic tertiary amine compound and the styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene, and N-phenylcarbazole.

Other examples include compounds having two condensed aromatic rings in the molecule described in U.S. Pat. No. 5,061,569, such as 4,4'-bis[N-(1-naphthyl)-N-phenylamino]biphenyl (NPD), and compounds having three triphenylamine units linked in a starburst form described in Japanese Unexamined Patent Application Publication No. H4-308688, such as 4,4',4"-tris[N-(3-methylphenyl)-N-phenylamino]triphenylamine (MTDATA).

The hole transporting material may be a polymer material containing any of the aforementioned materials in the polymer chain, or a polymer material having a main chain composed of any of the materials. The hole injecting material or the hole transporting material may be an inorganic compound, such as p-type Si or p-type SiC.

The hole transporting material may be of a p-type described in Japanese Unexamined Patent Application Publication No. H11-251067 or J. Huang et al., Applied Physics Letters, 80 (2002), p. 139. In the present invention, such a material is preferably used in view of improvement in emission efficiency of the luminous element.

The hole transporting layer, which is in the form of thin film, can be formed from any of the aforementioned hole transporting materials by any known process, such as vacuum deposition, spin coating, casting, ink jetting, printing, or Langmuir-Blodgett (LB) deposition. The hole transporting layer may have any thickness. The thickness is in the range of generally about 5 nm to 5 μm, preferably 5 to 200 nm. The hole transporting layer may have a single-layer structure composed of one or more of the aforementioned materials.

The hole transporting layer may be a highly p-type layer doped with an impurity. Examples include those described in Japanese Unexamined Patent Application Publication Nos. H4-297076, 2000-196140, and 2001-102175, and J. Appl. Phys., 95, 5773 (2004).

Such a high p-type hole transporting layer is preferably used for reducing the power consumption of the element.

(Electron Transporting Layer)

The electron transporting layer is composed of a material having electron transporting function. The electron transporting layer includes the electron injecting layer and the hole blocking layer in a broad sense. The electron transporting layer may have a single-layer or multi-layer structure.

The electron transporting layer, which has a single-layer or multi-layer structure, has a portion adjacent to the luminous layer, and the portion may be composed of any electron transporting material (or hole blocking material) which can transfer electrons injected from the cathode to the luminous layer. The electron transporting material may be any known compound. Examples thereof include derivatives of nitro-substituted fluorene, diphenylquinone, thiopyran dioxide, carbodiimide, fluorenylidenemethane, anthraquinodimethane, anthrone, and oxadiazole. Other examples of the material for the electron transporting layer include thiadiazole derivatives containing a sulfur atom in the place of the oxygen atom of the oxadiazole ring of the oxadiazole derivatives, and quinoxaline derivatives having a quinoxaline ring known as an electron-attractive group. The electron transporting material may be a polymer material containing any of the aforementioned materials in the polymer chain, or a polymer material having a main chain composed of any of the materials.

Other examples of the electron transporting material include metal complexes of 8-quinolinol derivatives, such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (Znq); and these metal complexes in which the central metal is substituted to In, Mg, Cu, Ca, Sn, Ga, or Pb.

The material for the electron transporting layer is preferably metal-free phthalocyanine, metal phthalocyanine, or a phthalocyanine compound having alkyl- or sulfonate-substituted terminals. The material for the electron transporting layer may be a distyrylpyrazine derivative, which is also exemplified as a material for the luminous layer. As in the hole injecting layer or the hole transporting layer, the electron transporting layer may be composed of an inorganic semiconductor material, such as n-type Si or n-type SiC.

The electron transporting layer, which is in the form of thin film, can be formed from any of the aforementioned electron transporting materials by any known process, such as vacuum deposition, spin coating, casting, ink jetting, printing, or LB deposition. The electron transporting layer may have any thickness, but the thickness is generally about 5 nm to 5 μm, preferably 5 to 200 nm. The electron transporting layer may have a single-layer structure composed of one or more of the aforementioned materials.

The electron transporting layer may be a highly n-type layer doped with an impurity. Examples of such an electron transporting layer include those described in Japanese Unexamined Patent Application Publication Nos. H4-297076, H10-270172, 2000-196140, and 2001-102175, and J. Appl. Phys., 95, 5773 (2004). The electron transporting layer preferably contains potassium or a potassium compound, such as potassium fluoride. Such a highly n-type electron transporting layer is used for reducing the power consumption of the organic EL element.

The material for the electron transporting layer (electron transporting compound) may be the same as that for the intermediate layer. Even when the electron transporting layer also serves as the electron injecting layer, the material therefor may be the same as that for the intermediate layer.

(Blocking Layer)

The blocking layer (i.e., hole blocking layer or electron blocking layer) is optionally provided in addition to the aforementioned layers of the organic functional layer unit 3. Examples of the blocking layer include hole blocking layers described in Japanese Unexamined Patent Application Publication Nos. H11-204258 and H11-204359 and "Organic EL element and its forefront of industrialization (published by NTS Corporation, Nov. 30, 1998)" (p. 237).

The hole blocking layer functions as an electron transporting layer in a broad sense. The hole blocking layer is composed of a material which transports electrons and has a very low capability of transporting holes. The hole blocking layer, which transports electrons and blocks holes, can increase the probability of recombination of electrons and holes. The electron transporting layer may optionally be used as the hole blocking layer. The hole blocking layer is preferably disposed adjacent to the luminous layer.

The electron blocking layer functions as the hole transporting layer in a broad sense. The electron blocking layer is composed of a material which transports holes and has a very low capability of transporting electrons. The electron blocking layer, which transports holes and blocks electrons, can increase the probability of recombination of electrons and holes. The hole transporting layer may optionally be used as the electron blocking layer. The hole blocking layer used in the present invention preferably has a thickness of 3 to 100 nm, more preferably 5 to 30 nm.

[Second Electrode]

The second electrode 6 is an electrode film for supplying holes to the second organic functional layer unit 3B or the third organic functional layer unit 3E. The second electrode 6 is composed of a metal, an alloy, an organic or inorganic conductive compound, or a mixture thereof. Specific examples include gold, aluminum, silver, magnesium, lithium, mixtures of magnesium and copper, mixtures of magnesium and silver, mixtures of magnesium and aluminum, mixtures of magnesium and indium, indium, mixtures of lithium and aluminum, rare-earth metals, and oxide semiconductors, such as ITO, ZnO, $TiO_2$, and $SnO_2$.

The second electrode 6, which is in the form of thin film, can be formed from any of these conductive materials by any process, such as vapor deposition or sputtering. The second electrode 6 preferably has a sheet resistance of several hundreds of Ω/square or less. The second electrode 6 generally has a thickness of 5 nm to 5 μm, preferably 5 to 200 nm.

If the organic EL element 100 or 200 is a both side illumination type configured to extract emitted light L through the second electrode 6 also, the second electrode 6 is composed of a highly translucent material. In such a case, the aforementioned underlying layer 41, 42, or 43 may be provided on a face, adjacent to the second electrode 6, of the corresponding organic functional layer unit 3.

[Sealing Member]

Examples of the means for sealing of the organic EL element of the present invention include a process of bonding a sealing member to the second electrode 6 and the transparent substrate 1 with an adhesive.

The sealing member only needs to be disposed to cover a display area of the organic EL element. The sealing member may be in the form of concave plate or flat plate. The sealing member may have transparency or electrical insulating property.

Specific examples of the sealing member include glass plates, polymer plates, polymer films, metal plates, and metal films. Examples of the glass plates include plates composed of soda-lime glass, barium-strontium-containing glass, lead glass, aluminosilicate glass, borosilicate glass, barium borosilicate glass, and quartz. Examples of the polymer plate include plates composed of polycarbonates, acrylic resins, polyethylene terephthalate), polyether sulfides, and polysulfones. Examples of the metal plate include plates composed of one or more metals selected from the group consisting of stainless steel, iron, copper, aluminum, magnesium, nickel, zinc, chromium, titanium, molybdenum, silicon, germanium, and tantalum and alloys of the metals.

The sealing member is preferably a polymer film or a metal film in view of a reduction in thickness of the organic EL element. The polymer film preferably has a water vapor transmission rate (25±0.5° C., relative humidity of 90±2%) of $1\times10^{-3}$ $g/m^2 \cdot 24$ h or less as determined in accordance with JIS K 7129-1992. The polymer film more preferably has an oxygen transmission rate of $1\times10^{-3}$ $mL/m^2 \cdot 24$ h·atm (1 atm=$1.01325\times10^5$ Pa) or less as determined in accordance with JIS K 7126-1987 and a water vapor transmission rate (25±0.5° C., relative humidity of 90±2%) of $1\times10^{-3}$ $g/m^2 \cdot 24$ h or less.

The sealing member may be formed into a concave plate by sandblasting or chemical etching. Specific examples of the adhesive include photocurable and thermosetting adhesives containing reactive vinyl groups of acrylic acid oligomers and methacrylic acid oligomers, moisture-curable adhesives, such as 2-cyanoacrylate esters, and thermosetting and chemical-curable adhesives (two-component adhesives), such as epoxy adhesives. Other examples include hot-melt polyamides, polyesters, and polyolefins, and cationic UV-curable epoxy resin adhesives.

Since the organic EL element may be degraded through thermal treatment, an adhesive is preferably used which can be cured at a temperature of room temperature to 80° C. The adhesive may contain a desiccant dispersed therein. The adhesive may be applied to the sealing member with a commercially available dispenser or by screen printing.

An inorganic or organic layer, serving as a sealing film, is preferably formed on the outer side of the second electrode 6 which sandwiches the organic functional layer unit 3 with the transparent substrate 1 so as to cover the second electrode 6 and the organic functional layer unit 3 and to come into contact with the transparent substrate 1. The sealing film may be formed from any material capable of preventing intrusion of a substance which causes degradation of the organic EL element, such as moisture or oxygen. Examples of the material include silicon oxide, silicon dioxide, and silicon nitride. In view of enhancement of the strength, the sealing film preferably has a layered structure composed of an inorganic layer and an organic material layer. The sealing film may be formed by any known process. Examples of the process include vacuum deposition, sputtering, reactive sputtering, molecular beam epitaxy, the ionized-cluster beam method, ion plating, plasma polymerization, atmospheric pressure plasma polymerization, plasma CVD, laser CVD, thermal CVD, and coating.

The space between the sealing member and the display area of the organic EL element is preferably filled with an inert gas (e.g., nitrogen or argon) or an inert liquid (e.g., fluorohydrocarbon or silicone oil). The space between the sealing member and the display area of the organic EL element may be vacuum, or may be filled with a hygroscopic compound. Examples of the hygroscopic compound include metal oxides (e.g., sodium oxide, potassium oxide, calcium oxide, barium oxide, magnesium oxide, and aluminum oxide), sulfates (e.g., sodium sulfate, calcium sulfate, magnesium sulfate, and cobalt sulfate), metal halides (e.g., calcium chloride, magnesium chloride, cesium fluoride, tantalum fluoride, cerium bromide, magnesium bromide, barium iodide, and magnesium iodide), and perchlorates (e.g., barium perchlorate and magnesium perchlorate). Preferred are anhydrides of sulfates, metal halides, and perchlorates.

<Applications>

The organic EL element of the present invention has enhanced viewing angle dependence, exhibits different hues at different observation angles, and provides a wide variety of color expressions. The organic EL element can be used in new applications involving various color expressions, such as display devices and light sources. Examples of the light sources include, but are not limited to, household lighting devices, in-vehicle lighting devices, backlight units of watches and liquid crystal displays, billboards, traffic signals, light sources for optical storage media, light sources for electrophotocopiers, light sources for optical communication processors, and light sources for optical sensors. In particular, the organic EL element can be effectively used in combination with a color filter for a backlight unit of a liquid crystal display device and a light source for illumination. If the organic EL element is used in combination with a color filter for a backlight unit of a display, the element is preferably combined with a light condensing sheet for further enhancement of luminance.

Example 1

(1) Preparation of Preform of Element (1.1) Preform 1 of Element (Having the Configuration Shown in FIG. 1)
(Preparation of Transparent Substrate (1))

A transparent, alkali-free glass substrate having a thickness of 150 µm was used.

A UV-curable organic/inorganic hybrid hard coating material OPSTAR 27501 (manufactured by JSR Corporation) was applied to a coatable surface of the transparent substrate with a wire bar so as to adjust the dry thickness of a coating film to 4 µm. The coating material was dried at 80° C. for three minutes, and then cured in an air atmosphere with a high-pressure mercury lamp at 1.0 J/cm².

(Formation of Gas Barrier Layer)

Subsequently, a gas barrier layer having a thickness of 300 nm was formed on the resultant thin film by an excimer process described below.

<Preparation of Coating Solution for Formation of Polysilazane Layer>

A 10 mass % solution of perhydropolysilazane (Aquamica NN120-10, non-catalytic type, manufactured by AZ Electronic Materials) in dibutyl ether was used as a coating solution for formation of a polysilazane layer.

<Formation of Polysilazane Layer>

The resultant coating solution was applied with a wireless bar so as to adjust the average dry thickness of a coating film to 300 nm. The coating film was dried at 85° C. and a relative humidity of 55% for one minute. The coating film was then subjected to dehumidification treatment at 25° C. and a relative humidity of 10% (dew-point temperature: −8° C.) for 10 minutes, to form a polysilazane layer.

<Formation of Gas Barrier Layer: Conversion of Polysilazane Layer into Silica Layer with UV Light>

Subsequently, the substrate having the resultant polysilazane layer was placed in a vacuum chamber equipped with a UV irradiation apparatus described below, and the polysilazane layer was converted into a silica layer under control of the pressure in the apparatus.

<UV Irradiation Apparatus>

Apparatus: excimer irradiation apparatus MODEL: MECL-M-1-200, manufactured by M. D. COM. Inc.
Irradiation wavelength: 172 nm
Gas in lamp: Xe <Conditions for Modification>

The substrate having the polysilazane layer formed thereon was fixed onto an operation stage, and was then subjected to a modification treatment under the following conditions, to form a gas barrier layer.

Light intensity of excimer lamp: 130 mW/cm² (172 nm)
Distance between workpiece and light source: 1 mm
Stage heating temperature: 70° C.
Oxygen concentration in irradiation apparatus: 1.0%
Irradiation time of excimer lamp: 5 seconds (Formation of First Electrode (2))

An indium tin oxide (ITO) film having a thickness of 100 nm was formed on the transparent substrate 1 by sputtering, to prepare a first electrode (anode). The first electrode was patterned to achieve an emission area of 50 mm².

(Formation of First Organic Functional Layer Unit (3A))

Subsequently, the substrate was placed in a commercially available vacuum deposition apparatus, and the apparatus was evacuated to 1×10⁻⁴ Pa. While the substrate was moved, compound HAT-CN was deposited at a rate of 0.1 nm/second, to form a hole injecting layer (charge injecting layer) having a thickness of 10 nm.

Compound HT-1 was then deposited at a rate of 0.1 nm/second, to form a hole transporting layer (HTL) having a thickness of 40 nm.

Current was applied to a heating boat containing host material H-1 and a heating boat containing phosphorescent compound A-3 (blue light-emitting dopant), to form, on the hole transporting layer, a luminous layer having a thickness of 30 nm and containing host material H-1 and phosphorescent compound A-3 (blue light-emitting dopant). In this process, the current applied to the heating boats was adjusted so that the rate of depositing host compound H-1 and the rate of depositing compound A-3 (blue light-emitting dopant) were 93:7 (proportions by volume).

Compound ET-1 was then deposited to form an electron transporting layer having a thickness of 20 nm.

(Formation of Intermediate Electrode Layer Unit (4A))

<Formation of Underlying Layer (41B)>

A workpiece including the first organic functional layer unit was fixed to a substrate holder of a commercially available vacuum deposition apparatus and placed in a vacuum chamber of the apparatus.

Compound N (nitrogen atom-containing compound) was placed in a resistance heating boat made of tantalum. The substrate holder and the heating boat were placed in the vacuum chamber of the vacuum deposition apparatus.

The vacuum chamber was evacuated to $4\times10^{-4}$ Pa, and the resistance heating boat in the vacuum chamber was heated through application of current, to form an underlying layer.

[F3]

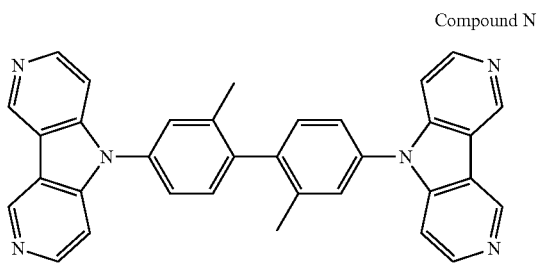

Compound N

<Formation of Intermediate Electrode (41A)>

Subsequently, an ITO film having a thickness of 100 nm was formed by sputtering on a workpiece including the underlying layer, to form an intermediate electrode. The intermediate electrode was patterned to achieve an emission area of 50 mm².

(Formation of Second Organic Functional Layer Unit (3B))

Subsequently, a second organic functional layer unit was formed on the resultant intermediate electrode layer unit through the following process.

As in the first organic functional layer unit, the substrate was placed in a commercially available vacuum deposition apparatus, and the apparatus was evacuated to $1\times10^{-4}$ Pa. While the substrate was moved, compound HAT-CN was deposited at a rate of 0.1 nm/second, to form a hole injecting layer having a thickness of 10 nm on the intermediate electrode of the intermediate electrode layer unit.

A second organic functional layer unit was then formed as in the first organic functional layer unit. Specifically, compound HT-1 was deposited at a rate of 0.1 nm/second, to form a hole transporting layer (HTL) having a thickness of 80 nm.

Current was applied to a heating boat containing host material H-1, a heating boat containing compound A-1 (green light-emitting dopant), and a heating boat containing compound A-2 (red light-emitting dopant) separately, to form, on the hole transporting layer, a luminous layer having a thickness of 30 nm and containing host material H-1, phosphorescent compound A-1 (green light-emitting dopant), and phosphorescent compound A-2 (red light-emitting dopant). In this process, the current applied to the heating boats was adjusted so that the rate of depositing host compound H-1, rate of depositing compound A-1 (green light-emitting dopant), and rate of depositing compound A-2 (red light-emitting dopant) were 89:10:1 (proportions by volume).

Compound ET-1 was then deposited to form an electron transporting layer having a thickness of 20 nm.

(Formation of Second Electrode (6))

Subsequently, a potassium fluoride (KF) film having a thickness of 2 nm was formed, and an aluminum film having a thickness of 110 nm was then formed by vapor deposition, to prepare a second electrode (cathode).

(Sealing)

A workpiece including the second electrode (cathode) was sealed with a sealing member composed of an aluminum foil (thickness: 100 μm) having one surface coated with a thermosetting liquid adhesive (epoxy resin) (thickness: 30 μm). Specifically, the adhesive surface of the sealing member was continuously bonded to the surface of the second electrode by a dry lamination process such that the ends of the first and second electrodes were exposed to the outside, to prepare a tandem preform 1 of an element including two sealed organic functional layer units.

The sealing process was carried out in accordance with JIS B 9920 under atmospheric pressure in a nitrogen atmosphere (moisture content: 1 ppm or less); specifically, under atmospheric pressure (oxygen concentration: 0.8 ppm or less) at a cleanness of class 100 and a dew-point temperature of −80° C. or less.

Description of formation of lead lines on the anode and the cathode is omitted.

In the preform 1, a lead wire was provided between the first and second electrodes, and the connection terminals of the respective electrodes were connected to a driving power source V1.

The specific structures of compounds HAT-CN, HT-1, A-1 to 3, H-1, and ET-1 used for preparation of the preform 1 are as follows:

[F4]

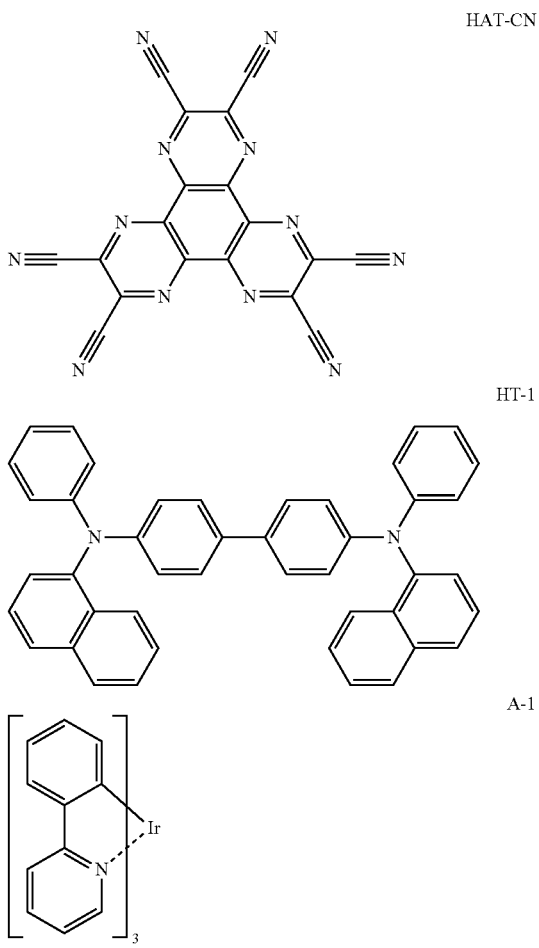

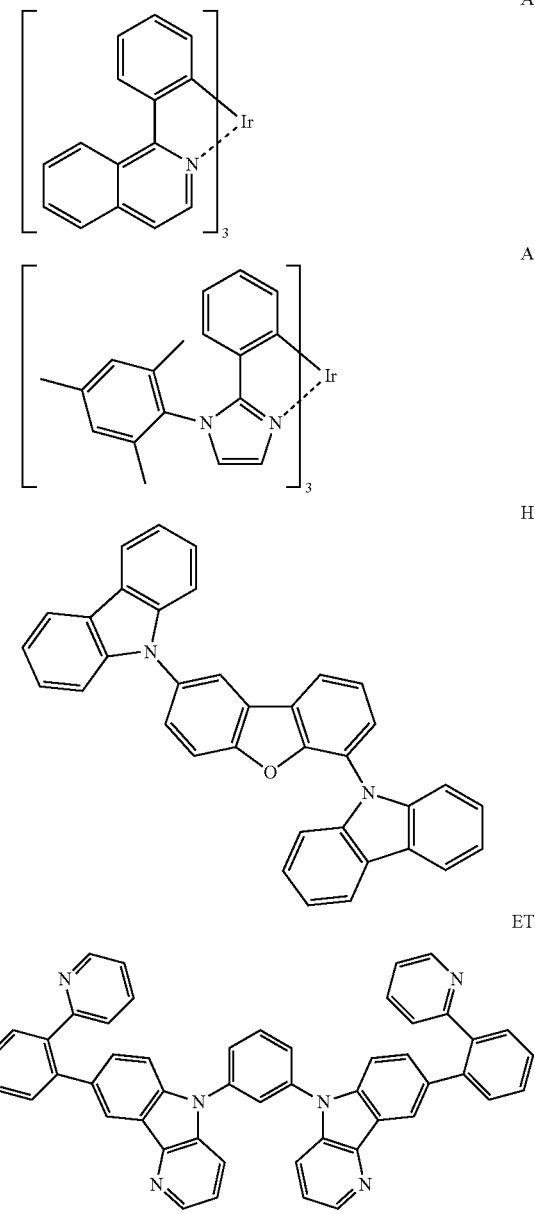

(1.2) Preparation of Preform 2 of Element

A preform 2 of an element was prepared as in the preform 1, except that the first electrode (anode) was formed as described below.

(Formation of First Electrode)

A tungsten resistance heating boat containing silver (Ag) was placed in a vacuum chamber. A transparent substrate was placed in the vacuum chamber, and the vacuum chamber was evacuated to $4 \times 10^{-4}$ Pa. Thereafter, the resistance heating boat in the vacuum chamber was heated through application of current, and a silver (Ag) layer having a thickness of 10 nm was formed by a mask patterning process. The layer was patterned to achieve an emission area of 50 mm².

Subsequently, a nitrogen atom-containing compound (compound N) was added to a tantalum resistance heating boat. The heating boat and a substrate holder holding the transparent substrate having the silver layer were placed in a vacuum chamber of a vacuum deposition apparatus. The vacuum chamber was evacuated to $4 \times 10^{-4}$ Pa, and the resistance heating boat in the vacuum chamber was then heated through application of current, to form a nitrogen-containing layer having a thickness of 25 nm.

[F5]

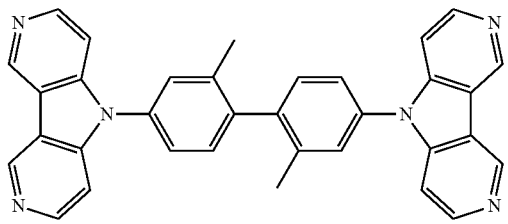

Compound N (1.3) Preform 3 of Element

A preform 3 of an element was prepared as in the preform 2, except that the transparent substrate was replaced with a poly(ethylene terephthalate) (PET) substrate having a thickness of 150 μm.

(1.4) Preform 4 of Element

A preform 4 of an element was prepared as in the preform 2, except that the transparent substrate was replaced with a poly(ethylene naphthalate) (PEN) substrate having a thickness of 150 μm.

Figure 6:
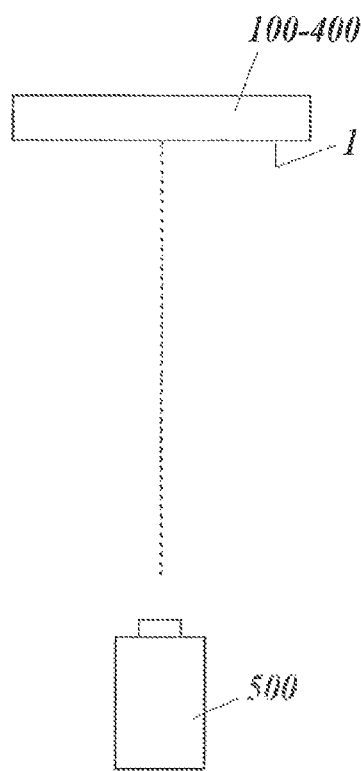
FIG. 6 is a schematic top view illustrating the positional relationship between an organic EL element and a chromaticity meter.

(2) Evaluation of Preform of Element (2.1) Evaluation of Dependence of Chromaticity on Angle During Non-Emission of Light For each of the resultant preforms 1 to 4, the chromaticity of reflected light was determined during non-emission of light in the same manner as described above with reference to FIGS. 5 to 7.

A chromameter CS-100A (manufactured by KONICA MINOLTA, INC.) was placed in front of a preform in a non-emission state, and chromaticities x0 and y0 were measured. Subsequently, chromaticities xθ and yθ were measured at an angle θ tilted from the front of the preform of the element.

Chromaticities were then measured at a tilt angle θ within a range of 0 to 80°, and the chromaticity difference (ΔExyθ) from the chromaticity of the front was calculated by Expression 1. The maximum ΔExyθ was defined as the ΔExy1 of the preform.

$$\Delta Exy\theta = [(x\theta - x0)^2 + (y\theta - y0)^2]^{1/2} \quad \text{Expression 1:}$$

(2.2) Evaluation of Dependence of Chromaticity on Angle During Emission of Light For each of the resultant preforms 1 to 4, the chromaticity of emitted light was determined during emission of light in the same manner as described above with reference to FIGS. 5 to 7.

Each preform was caused to emit light at a luminance of 1,000 cd/m² in front of the element, and chromaticities x1 and y1 of the front were measured with a spectroradiometer CS-2000 (manufactured by KONICA MINOLTA, INC.). Subsequently, chromaticities xθ and yθ were measured at an angle θ tilted from the front of the preform.

Chromaticities were then measured at a tilt angle A within a range of 0 to 80°, and the chromaticity difference (ΔExyθ)

from the chromaticity of the front was calculated by Expression 2. The maximum ΔExyθ was defined as the ΔExy2 of the preform.

$$\Delta Exy\theta = [(x\theta - x1)^2 + (y\theta - y1)^2]^{1/2} \quad \text{Expression 2:}$$

Table 1 shows the results of evaluation of the preforms 1 to 4.

TABLE 1

| SAMPLE OF PREFORM OF ELEMENT | ΔExy1 | ΔExy2 | NOTE |
|---|---|---|---|
| 1 | 0.02 | <0.01 | COMPARATIVE |
| 2 | 0.05 | 0.06 | INVENTIVE |
| 3 | 0.10 | 0.09 | INVENTIVE |
| 4 | 0.07 | 0.08 | INVENTIVE |

(3) Conclusion

As illustrated in Table 1, the preforms 2 to 4 exhibit ΔExy1 and ΔExy2 greater than those of the preform 1. The results indicate that each of these preforms exhibits different hues at different observation angles during both non-emission and emission modes of light, which has not yet been achieved by conventional white light-emitting devices.

Example 2

(1) Production of Organic EL Element Exhibiting Emission Pattern (1.1) Organic EL Element 101

The emission surface of the preform 1 was irradiated with UV rays from a UV tester SUV-W151 (manufactured by Iwasaki Electric Co., Ltd.: 100 mW/cm$^2$) via a patterning mask for four hours, to produce an organic EL element 101.

The patterning mask was disposed such that the area ratio of an irradiated region to a non-irradiated region was about 1:1.

(1.2) Organic EL Element 102

An organic EL element 102 was produced as in the organic EL element 101, except that the preform 1 was replaced with the preform 2.

(1.3) Organic EL Element 103A

An organic EL element 103A was produced as in the organic EL element 101, except that the preform 1 was replaced with the preform 3, and the preform was irradiated with UV rays for two hours.

(1.4) Organic EL Element 103B

An organic EL element 103B was produced as in the organic EL element 103A, except that a short-wavelength cutoff filter IHU-340 (manufactured by Isuzu Glass Ltd., capable of transmitting 50% or less light having a wavelength of 340 nm or shorter) was disposed between the patterning mask and the UV tester, and that the preform was irradiated with UV rays for six hours.

(1.5) Organic EL Element 104

An organic EL element 104 was produced as in the organic EL element 103B, except that the preform 3 was replaced with the preform 4, and the preform was irradiated with UV rays for eight hours.

(2) Evaluation of Organic EL Element (2.1) Evaluation of Visibility of Pattern Formed Through Irradiation with UV Rays During Non-Emission of Light For each of the resultant organic EL elements 101 to 104, the chromaticity b*0 of a portion of the element surface not irradiated with UV rays was measured during non-emission of light, and the chromaticity b*UV of a portion of the element surface irradiated with UV rays was also measured during non-emission of light. The chromaticity Δb* during non-emission of light, which corresponds to transformation of the element irradiated with UV rays, was determined by the following Expression 3:

$$\Delta b^* = b^*UV - b^*0 \quad \text{Expression 3:}$$

The chromaticity b* was measured with a spectrocolorimeter CM-2600d (manufactured by KONICA MINOLTA, INC.).

A larger Δb* facilitates visual observation of a difference, whereas a Δb* of 1.0 or less precludes discrimination.

(2.2) Evaluation of Visibility of Pattern Formed Through Irradiation with UV Rays During Emission of Light Each of the organic EL elements 101 to 104 was caused to emit light such that the portion not irradiated with UV rays exhibited a front luminance of 1,000 cd/m$^2$. Subsequently, the luminance L-0 of the portion not irradiated with UV rays and the luminance L-UV of the portion irradiated with UV rays were measured, and the luminance ratio $L_{UV/0}$(%) was determined by the following Expression 4:

$$L_{UV/0}(\%) = (L\text{-}UV/L\text{-}0) \times 100 \quad \text{Expression 4:}$$

The luminance L was measured with a two-dimensional luminance colorimeter CA-2000 (manufactured by KONICA MINOLTA, INC.).

A smaller $L_{UV/0}$(%) indicates formation of a clear pattern through irradiation with UV rays. The $L_{UV/0}$(%) is preferably 20 or less.

Table 2 shows the results of evaluation of the organic EL elements 101 to 104.

TABLE 2

| SAMPLE OF ORGANIC EL ELEMENT | Δb* | $L_{UV/0}$ (%) | NOTE |
|---|---|---|---|
| 101 | 0.01 | 0.7 | COMPARATIVE |
| 102 | 0.01 | 0.8 | INVENTIVE |
| 103A | 1.0 | 20.0 | INVENTIVE |
| 103B | 0.9 | 2.0 | INVENTIVE |
| 104 | 0.8 | 8.0 | INVENTIVE |

(3) Conclusion

As illustrated in Table 2, each of the organic EL elements 101 to 104 exhibits a Δb* of 1.0 or less and provides a pattern that cannot be observed during non-emission and that can be visually observed only during emission of light.

Although the organic EL element 103A exhibits a Δb* of 1.0, which is probably due to slight yellowing of the resin, the organic EL element 103B exhibits a Δb* of less than 1.0 despite long-term irradiation with UV rays. The results indicate that irradiation with light not containing a wavelength component of 340 nm or shorter is useful for improvement of visibility.

Each of the organic EL elements 101 to 104 exhibits a small $V_{UV/0}$ value and forms a clear emission pattern through irradiation with UV rays.

In particular, the organic EL element 103B exhibits a $L_{UV/0}$ of 2.0, which is much smaller than that of organic EL element 104 ($L_{UV/0}$: 8.0). The results indicate that PET transmits more UV rays than PEN, and thus PET is useful for forming a clear emission pattern through irradiation with light.

As described above, the organic EL element of the present invention exhibits different hues at different observation angles during both non-emission and emission modes of light, and provides a pattern that can be visually observed only during emission of light, which has not yet been achieved by conventional light-emitting devices.

The patterning process by irradiation with light through a patterning mask is more useful than a patterning process with a mask during formation of an organic layer, in view of precise and simple formation of any desired pattern.

INDUSTRIAL APPLICABILITY

The present invention provides a method for producing an organic electroluminescent element. The method is particularly suitable for use in production of an organic electroluminescent element which exhibits different hues at different observation angles during non-emission of light, and which forms a clear emission pattern during emission of light.

DESCRIPTION OF REFERENCE NUMERALS

1: transparent substrate
2: first electrode (anode)
3, 3A, 3B, 3C, 3D, 3E: organic functional layer unit
4, 4A, 4B, 4C: intermediate electrode layer unit
41A, 42A, 43A: intermediate electrode
41B, 42B, 43B: underlying layer
6: second electrode (cathode)
100, 200, 300, 400: organic EL element
500: chromaticity meter
V1, V2, V3: driving voltage

The invention claimed is:

1. A method for producing an organic electroluminescent element including a transparent substrate, a transparent electrode, an organic functional layer unit, and an electrode counter to the transparent electrode disposed in sequence, the method comprising:

forming a preform of an element satisfying the following expression: $\Delta Exy \geq 0.05$, wherein $\Delta Exy$ corresponds to maximum $\Delta Exy\theta$, $\Delta Exy\theta = [(x\theta - x0)^2 + (y\theta - y0)^2]^{1/2}$, $x0$ and $y0$ correspond to a chromaticity measured at a tilt angle of 0, the tilt angle of 0 being an angle orthogonal to a reference surface of the transparent substrate, $x\theta$ and $y\theta$ correspond to a chromaticity measured at a tilt angle within the range 0 to 60° on both x- and y-direction, and the preform satisfies $\Delta Exy \geq 0.05$ for both a reflected light during a non-emission mode and an emitted light during an emission mode; and irradiating a specific region of the preform of the element with light to form a non-luminous portion.

2. The method for producing an organic electroluminescent element according to claim 1, wherein the transparent electrode disposed on the transparent substrate includes a metal layer including elemental silver or a silver-based alloy.

3. The method for producing an organic electroluminescent element according to claim 1, wherein the transparent electrode disposed on the transparent substrate includes a metal layer including elemental silver or a silver-based alloy, and a nitrogen-containing layer containing a compound having a structure represented by Formula (1):

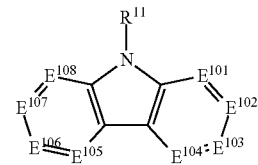

wherein E101 to E108 each represent —C(R12)= or —N=, at least one of E101 to E108 is —N=, and R11 and R12 each represent a hydrogen atom or a substituent.

4. The method for producing an organic electroluminescent element according to claim 1, wherein the transparent substrate includes a resin film, and the preform of the element is irradiated with light not containing a wavelength component of 340 nm or shorter.

* * * * *